United States Patent
Naoi et al.

(10) Patent No.: US 8,298,743 B2
(45) Date of Patent: Oct. 30, 2012

(54) POSITIVE-TYPE PHOTOSENSITIVE COMPOSITION, TRANSPARENT CONDUCTIVE FILM, DISPLAY ELEMENT AND INTEGRATED SOLAR BATTERY

(75) Inventors: Kenji Naoi, Ashigarakami-gun (JP); Yoichi Hosoya, Ashigarakami-gun (JP); Nori Miyagishima, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 244 days.

(21) Appl. No.: 12/761,119

(22) Filed: Apr. 15, 2010

(65) Prior Publication Data
US 2010/0266956 A1    Oct. 21, 2010

(30) Foreign Application Priority Data

Apr. 16, 2009   (JP) .................................. 2009-100088

(51) Int. Cl.
*G03F 7/023*    (2006.01)
*G03F 7/30*    (2006.01)

(52) U.S. Cl. ........ 430/165; 430/191; 430/192; 430/193; 430/326

(58) Field of Classification Search .................. 430/165, 430/191, 192, 193, 326
See application file for complete search history.

(56) References Cited

U.S. PATENT DOCUMENTS

| | | |
|---|---|---|
| 6,709,800 B2 * | 3/2004 | Fujita et al. ................ 430/270.1 |
| 2008/0131813 A1 * | 6/2008 | Etou et al. ................. 430/280.1 |

FOREIGN PATENT DOCUMENTS

| | | | | |
|---|---|---|---|---|
| JP | 51-034711 | A | | 3/1976 |
| JP | 56-122031 | A | | 9/1981 |
| JP | 05-165214 | A | | 7/1993 |
| JP | 2006251009 | A | * | 9/2006 |
| JP | 2007148186 | A | * | 6/2007 |

* cited by examiner

*Primary Examiner* — John Chu
(74) *Attorney, Agent, or Firm* — Sughrue Mion, PLLC

(57) ABSTRACT

A positive-type photosensitive composition including an alkali-soluble polymer formed through copolymerization of monomer (A) represented by the following General Formula (I) and other radical polymerizable monomer (B), a 1,2-quinonediazide compound, and a nanowire structure:

General Formula (I)

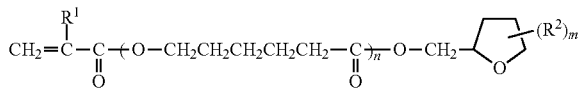

where $R^1$ represents a hydrogen atom or a methyl group, $R^2$ represents a hydrogen atom or a C1 to C5 alkyl group, n is an integer of 1 to 5, and m is an integer of 1 to 7.

28 Claims, 3 Drawing Sheets

POSITIVE-TYPE PHOTOSENSITIVE COMPOSITION, TRANSPARENT CONDUCTIVE FILM, DISPLAY ELEMENT AND INTEGRATED SOLAR BATTERY

BACKGROUND OF THE INVENTION

1. Field of the Invention

The present invention relates to a positive-type photosensitive composition used for producing, for example, a liquid crystal display element, an EL display element and an integrated solar battery; to a transparent conductive film using the positive-type photosensitive composition; to a display element; and to an integrated solar battery.

2. Description of the Related Art

A patterned transparent film is used in many parts of a display element such as a spacer, an insulative film and a protective film, and hitherto, many positive-type photosensitive compositions (hereinafter may be referred to as a "positive resist") have been proposed for forming the transparent film (see Japanese Patent Application Laid-Open (JP-A) Nos. 51-34711, 56-122031 and 05-165214).

In general, thin film transistor liquid crystal displays, an integrated solar batteries, etc. include an insulative film for insulating wirings planarily disposed in the form of laminate, the insulative film having a pattern formed through mechanical scribing or laser scribing. Widely used materials for forming the insulative film are positive-type photosensitive compositions which require a small number of steps for obtaining a desirably patterned insulative film. The positive-type photosensitive composition is desired to have a wide process margin in the process of forming an insulative film.

Further, the produced insulative film or display element using a positive-type photosensitive composition must be exposed, for example, to a solvent, an acid and an alkaline solution through immersion, and be thermally treated. With the recent developments of semiconductor technology, a positive-type photosensitive composition is required to meet stricter requirements year by year, and various attempts have been made to develop satisfactory compositions. But, no material has been reported which has high solvent resistance, high waterproofness, high alkali resistance, high heat resistance, high transparency, excellent adhesion to a base, etc., and keen demand has arisen for a material that have all of these properties.

Meanwhile, wirings are generally formed in light-transmissive portions as follows, considering required properties such as conductivity, transparency and patterning property. Specifically, indium tin oxide (hereinafter may be referred to as "ITO") and zinc oxide are applied through a dry process such as vapor-deposition or sputtering, and then a negative-type resist is used to form a transparent conductive pattern. But, the above production method requires a lot of steps for forming a patterned transparent conductive pattern, such as application of a negative-type resist, development thereof and etching of the conductive material; and also requires large facilities requiring vacuum conditions and a multi-step chemical treatment. Thus, the simplification of the process is desired in terms of not only improvement in performance of the final product but also the recent concerns about the environment and energy issues.

At present, in terms of process cost, environment and energy issues, there is a need to rapidly provide, for example, a positive-type photosensitive composition with which a patterned transparent conductive film can be formed through a simple process and which has high solvent resistance, high waterproofness, high alkali resistance, high heat resistance, high transparency, excellent adhesion to a base, high conductivity, etc.; a transparent conductive film which is formed from the positive-type photosensitive composition and which has high solvent resistance, high waterproofness, high alkali resistance, high heat resistance, high transparency, excellent adhesion to a base, etc.; and a display element and an integrated solar battery using the transparent conductive film.

BRIEF SUMMARY OF THE INVENTION

The present invention aims to provide a positive-type photosensitive composition with which a patterned transparent conductive film can be formed through a simple process and which has high solvent resistance, high waterproofness, high alkali resistance, high heat resistance, high transparency, excellent adhesion to a base, high conductivity, etc.; a transparent conductive film which is formed from the positive-type photosensitive composition and which has high solvent resistance, high waterproofness, high alkali resistance, high heat resistance, high transparency, excellent adhesion to a base, etc.; and a display element and an integrated solar battery using the transparent conductive film.

Means for solving the above problems are as follows.

<1> A positive-type photosensitive composition including:

an alkali-soluble polymer formed through copolymerization of monomer (A) represented by the following General Formula (I) and other radical polymerizable monomer (B), a 1,2-quinonediazide compound, and a nanowire structure:

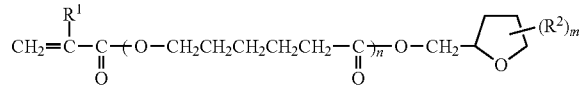

General Formula (I)

where $R^1$ represents a hydrogen atom or a methyl group, $R^2$ represents a hydrogen atom or a C1 to C5 alkyl group, n is an integer of 1 to 5, and m is an integer of 1 to 7.

<2> A positive-type photosensitive composition including:

an alkali-soluble polymer formed through copolymerization of monomer (A) represented by the following General Formula (II) and other radical polymerizable monomer (B), a 1,2-quinonediazide compound, and a nanowire structure:

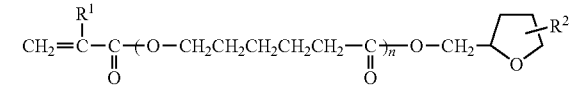

General Formula (II)

where $R^1$ represents a hydrogen atom or a methyl group, $R^2$ represents a hydrogen atom or a C1 to C5 alkyl group, and n is an integer of 1 to 5.

<3> The positive-type photosensitive composition according to one of <1> and <2> above, wherein the alkali-soluble polymer is formed through copolymerization of monomer (A) in an amount of 1% by mass to 80% by mass and monomer (B) in an amount of 20% by mass to 99% by mass, on the basis of the total mass of monomer (A) and monomer (B).

<4> The positive-type photosensitive composition according to any one of <1> to <3> above, wherein the other radical polymerizable monomer (B) contains no radical polymerizable monomer having a carboxyl group.

<5> The positive-type photosensitive composition according to any one of <1> to <4> above, wherein the other radical polymerizable monomer (B) contains at least one selected from oxetanyl-containing radical polymerizable monomer (b1), oxyranyl-containing radical polymerizable monomer (b2) and hydroxyl group-containing radical polymerizable monomer (b3).

<6> The positive-type photosensitive composition according to any one of <1> to <5> above, wherein the other radical polymerizable monomer (B) contains oxetanyl-containing radical polymerizable monomer (b1), oxyranyl-containing radical polymerizable monomer (b2) and hydroxyl group-containing radical polymerizable monomer (b3).

<7> The positive-type photosensitive composition according to <6> above, wherein the alkali-soluble polymer is formed through copolymerization of monomer (A) in an amount of 0.5% by mass to 85% by mass, monomer (b1) in an amount of 1% by mass to 80% by mass, monomer (b2) in an amount of 5% by mass to 50% by mass, and monomer (b3) in an amount of 1% by mass to 60% by mass, on the basis of the total mass of monomer (A), monomer (b1), monomer (b2) and monomer (b3).

<8> The positive-type photosensitive composition according to <6> above, wherein the alkali-soluble polymer is formed through copolymerization of monomer (A) in an amount of 1% by mass to 80% by mass, monomer (b1) in an amount of 5% by mass to 30% by mass, monomer (b2) in an amount of 10% by mass to 30% by mass, and monomer (b3) in an amount of 5% by mass to 50% by mass, on the basis of the total mass of monomer (A), monomer (b1), monomer (b2) and monomer (b3).

<9> The positive-type photosensitive composition according to any one of <5> to <8> above, wherein monomer (b1) contains at least one selected from (3-methyl-3-oxetanyl)methyl(meth)acrylate, (3-ethyl-3-oxetanyl)methyl (meth)acrylate, (3-methyl-3-oxetanyl)ethyl(meth)acrylate, (3-ethyl-3-oxetanyl)ethyl (meth)acrylate, (2-methyl-2-oxetanyl)methyl(meth)acrylate, (2-ethyl-2-oxetanyl)methyl (meth)acrylate, p-vinylphenyl-3-ethyloxetan-3-yl methyl ether, 2-phenyl-3-(meth)acryloxymethyloxetane, 2-trifluoromethyl-3-(meth)acryloxymethyloxetane and 4-trifluoromethyl-2-(meth)acryloxymethyloxetane.

<10> The positive-type photosensitive composition according to any one of <5> to <8> above, wherein monomer (b1) is a monomer represented by one of the following General Formulas (III) and (IV):

General Formula (III)

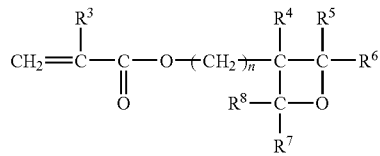

General Formula (IV)

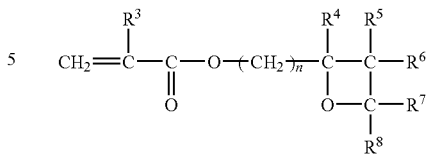

in General Formulas (III) and (IV), $R^3$ represents a hydrogen atom or a methyl group, $R^4$, $R^5$, $R^6$, $R^7$ and $R^8$ each independently represent a hydrogen atom, a C1 to C5 alkyl group, a C2 to C5 alkenyl group or a C2 to C5 alkynyl group, and n is an integer of 1 to 5.

<11> The positive-type photosensitive composition according to <10> above, wherein the oxetanyl-containing radical polymerizable monomer (b1) represented by General Formula (III) contains at least one selected from (3-ethyl-3-oxetanyl)methyl acrylate and (3-ethyl-3-oxetanyl)methyl methacrylate.

<12> The positive-type photosensitive composition according to <10> above, wherein the oxetanyl-containing radical polymerizable monomer (b1) represented by General Formula (IV) contains at least one selected from (2-ethyl-2-oxetanyl)methyl acrylate and (2-ethyl-2-oxetanyl)methyl methacrylate.

<13> The positive-type photosensitive composition according to any one of <5> to <12> above, wherein monomer (b2) contains at least one selected from glycidyl(meth)acrylate, methylglycidyl(meth)acrylate, α-ethylacrylic acid glycidyl ester and 3,4-epoxycyclohexyl(meth)acrylate.

<14> The positive-type photosensitive composition according to any one of <5> to <12> above, wherein monomer (b2) contains at least one selected from glycidyl acrylate, glycidyl methacrylate, methylglycidyl methacrylate and 3,4-epoxycyclohexyl methacrylate.

<15> The positive-type photosensitive composition according to any one of <5> to <14> above, wherein monomer (b3) contains at least one selected from hydroxylmethyl (meth)acrylate, 2-hydroxylethyl(meth)acrylate, 2-hydroxylpropyl (meth)acrylate, 3-hydroxylpropyl(meth)acrylate and 4-hydroxylbutyl (meth)acrylate.

<16> The positive-type photosensitive composition according to any one of <5> to <14> above, wherein monomer (b3) contains at least one selected from 2-hydroxylethyl acrylate, 2-hydroxylethyl methacrylate, 2-hydroxylpropyl acrylate and 2-hydroxylpropyl methacrylate.

<17> The positive-type photosensitive composition according to any one of <1> to <16> above, wherein the 1,2-quinonediazide compound is at least one selected from 2,3,4-trihydroxylbenzophenone-1,2-naphthoquinone diazide-4-sulfonic acid ester, 2,3,4-trihydroxylbenzophenone-1,2-naphthoquinone diazide-5-sulfonic acid ester, 4,4'-[1-[4-[1-[4-hydroxylphenyl]-1-methylethyl]phenyl]ethylidene]bisphenol-1,2-naphthoquinone diazide-4-sulfonic acid ester and 4,4'-[1-[4-[1-[4-hydroxylphenyl]-1-methylethyl]phenyl]ethylidene]bisphenol-1,2-naphthoquinone diazide-5-sulfonic acid ester.

<18> A positive-type photosensitive composition including:
an alkali-soluble polymer formed through copolymerization of monomer (A) represented by General Formula (II), at least one selected as oxetanyl-containing radical polymerizable monomer (b1) from (3-ethyl-3-oxetanyl)methyl acrylate and (3-ethyl-3-oxetanyl)methyl methacrylate, at least one selected as oxyranyl-containing radical polymerizable monomer (b2) from glycidyl (meth)acrylate, methylglycidyl(meth) acrylate, α-ethylacrylic acid glycidyl ester and 3,4-epoxycyclohexyl(meth)acrylate, and at least one selected as hydroxyl group-containing radical polymerizable monomer (b3) from 2-hydroxylethyl acrylate, 2-hydroxylethyl methacrylate, 2-hydroxylpropylacrylate and 2-hydroxylpropyl methacrylate, 4,4'-[1-[4-[1-[4-hydroxylphenyl]-1-methylethyl]phenyl] ethylidene]bisphenol-1,2-naphthoquinone diazide-5-sulfonic acid ester as a 1,2-quinonediazide compound, and a nanowire structure:

General Formula (II)

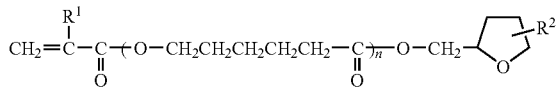

where $R^1$ represents a hydrogen atom or a methyl group, $R^2$ represents a hydrogen atom or a C1 to C5 alkyl group, and n is an integer of 1 to 5.

<19> A positive-type photosensitive composition including:

an alkali-soluble polymer formed through copolymerization of monomer (A) represented by General Formula (II), at least one selected as oxetanyl-containing radical polymerizable monomer (b1) from (2-ethyl-2-oxetanyl)methyl acrylate and (2-ethyl-2-oxetanyl)methyl methacrylate, at least one selected from as oxyranyl-containing radical polymerizable monomer (b2) from glycidyl (meth)acrylate, methylglycidyl (meth)acrylate, α-ethylacrylic acid glycidyl ester and 3,4-epoxycyclohexyl(meth)acrylate, and at least one selected as hydroxyl group-containing radical polymerizable monomer (b3) from 2-hydroxylethyl acrylate, 2-hydroxylethyl methacrylate, 2-hydroxylpropyl acrylate and 2-hydroxylpropyl methacrylate;

4,4'-[1-[4-[1-[4-hydroxylphenyl]-1-methylethyl]phenyl] ethylidene]bisphenol-1,2-naphthoquinone diazide-5-sulfonic acid ester as a 1,2-quinonediazide compound, and a nanowire structure:

General Formula (II)

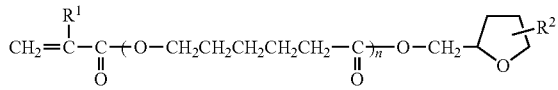

where $R^1$ represents a hydrogen atom or a methyl group, $R^2$ represents a hydrogen atom or a C1 to C5 alkyl group, and n is an integer of 1 to 5.

<20> The positive-type photosensitive composition according to one of <18> and <19> above, wherein the alkali-soluble polymer is formed through copolymerization of monomer (A) in an amount of 1% by mass to 80% by mass, monomer (b1) in an amount of 5% by mass to 30% by mass, monomer (b2) in an amount of 10% by mass to 30% by mass, and monomer (b3) in an amount of 5% by mass to 50% by mass, on the basis of the total mass of monomer (A), monomer (b1), monomer (b2) and monomer (b3).

<21> The positive-type photosensitive composition according to any one of <1> to <20> above, wherein the nanowire structure a metal nanowire.

<22> The positive-type photosensitive composition according to <21> above, wherein the metal nanowire has a diameter of 50 nm or less and a length of 5 μm or greater, and is contained in an amount of 50% by mass or more in terms of metal amount with respect to total metal particles.

<23> A transparent conductive film including:

the positive-type photosensitive composition according to any one of <1> to <22> above.

<24> A display element including:

the transparent conductive film according to <23> above.

<25> An integrated solar battery including:

the transparent conductive film according to <23> above.

The present invention can provide a positive-type photosensitive composition with which a patterned transparent conductive film can be formed through a simple process and which has high solvent resistance, high waterproofness, high alkali resistance, high heat resistance, high transparency, excellent adhesion to a base, high conductivity, etc.; a transparent conductive film which is formed from the positive-type photosensitive composition and which has high solvent resistance, high waterproofness, high alkali resistance, high heat resistance, high transparency, excellent adhesion to a base, etc.; and a display element and an integrated solar battery using the transparent conductive film. These can solve the existing problems pertinent in the art.

DETAILED DESCRIPTION OF THE INVENTION

Figure 1:
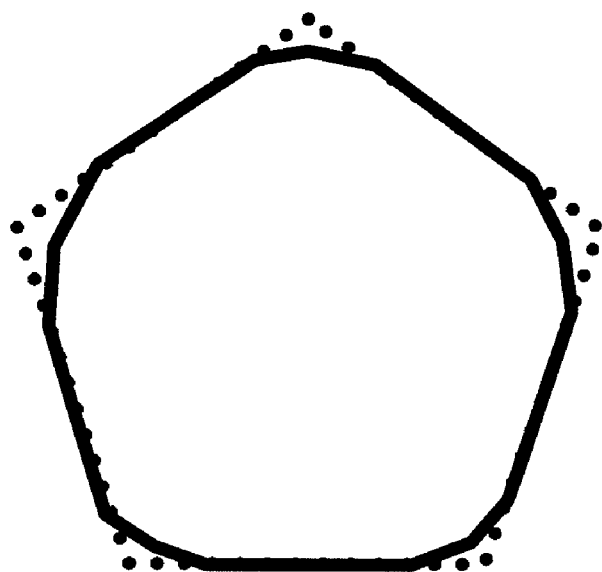
FIG. 1 is an explanatory diagram illustrating a method for obtaining a sharpness of a metal nanowire.

Next will be described in detail a positive-type photosensitive composition of the present invention. The constituent members of the positive-type photosensitive composition are described based on typical embodiments, which should not be construed as limiting the present invention thereto.

Notably, in the range "the lower value to the upper value" in the present specification, the range includes these lower and upper values; i.e., "the lower value inclusive to the upper value inclusive."

Also, in the present specification, acrylic acid and methacrylic acid may be collectively expressed as "(meth)acrylic acid." Similarly, acrylate and methacrylate may be collectively expressed as "(meth)acrylate."

(Positive-Type Photosensitive Composition)

In a first embodiment, the positive-type photosensitive composition of the present invention contains an alkali-soluble polymer formed through copolymerization of monomer (A) represented by the following General Formula (I) and radical polymerizable monomer (B), a 1,2-quinonediazide compound and a nanowire structure; and, if necessary, further contains other components:

General Formula (I)

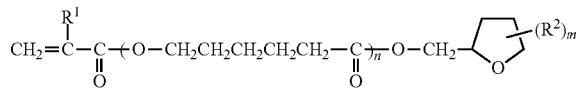

where $R^1$ represents a hydrogen atom or a methyl group, $R^2$ represents a hydrogen atom or a C1 to C5 alkyl group, n is an integer of 1 to 5 and m is an integer of 1 to 7.

In General Formula (I), the C1 to C5 alkyl group represented by $R^2$ is a linear or branched alkyl group. Examples thereof include methyl, ethyl, propyl, n-butyl, t-butyl and pentyl.

In a second embodiment, the positive-type photosensitive composition of the present invention contains an alkali-soluble polymer formed through copolymerization of monomer (A) represented by the following General Formula (II) and radical polymerizable monomer (B), a 1,2-quinonediazide compound and a nanowire structure; and, if necessary, further contains other components:

General Formula (II)

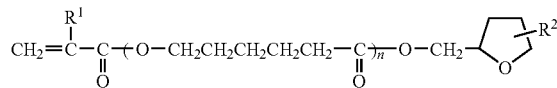

where $R^1$ represents a hydrogen atom or a methyl group, $R^2$ represents a hydrogen atom or a C1 to C5 alkyl group and n is an integer of 1 to 5.

In General Formula (II), the C1 to C5 alkyl group represented by $R^2$ is a linear or branched alkyl group. Examples thereof include methyl, ethyl, propyl, n-butyl, t-butyl and pentyl.

In a third embodiment, the positive-type photosensitive composition of the present invention contains an alkali-soluble polymer formed through copolymerization of monomer (A) represented by General Formula (II), at least one selected as oxetanyl-containing radical polymerizable monomer (b1) from the group consisting of (3-ethyl-3-oxetanyl)methyl acrylate and (3-ethyl-3-oxetanyl)methyl methacrylate, at least one selected as oxyranyl-containing radical polymerizable monomer (b2) from glycidyl(meth)acrylate, methylglycidyl(meth)acrylate, α-ethylacrylic acid glycidyl ester and 3,4-epoxycyclohexyl(meth)acrylate, and at least one selected as hydroxyl group-containing radical polymerizable monomer (b3) from 2-hydroxylethyl acrylate, 2-hydroxylethyl methacrylate, 2-hydroxylpropyl acrylate and 2-hydroxylpropyl methacrylate; 4,4'-[1-[4-[1-[4-hydroxylphenyl]-1-methylethyl]phenyl]ethylidene]bisphenol-1,2-naphthoquinone diazide-5-sulfonic acid ester as the 1,2-quinonediazide compound; and a nanowire structure; and, if necessary, further contains other components.

In a fourth embodiment, the positive-type photosensitive composition of the present invention contains an alkali-soluble polymer formed through copolymerization of monomer (A) represented by General Formula (II), at least one selected as oxetanyl-containing radical polymerizable monomer (b1) from (2-ethyl-2-oxetanyl)methyl acrylate and (2-ethyl-2-oxetanyl)methyl methacrylate, at least one selected from as oxyranyl-containing radical polymerizable monomer (b2) from glycidyl(meth)acrylate, methylglycidyl(meth)acrylate, α-ethylacrylic acid glycidyl ester and 3,4-epoxycyclohexyl(meth)acrylate, and at least one selected as hydroxyl group-containing radical polymerizable monomer (b3) from 2-hydroxylethyl acrylate, 2-hydroxylethyl methacrylate, 2-hydroxylpropylacrylate and 2-hydroxylpropyl methacrylate; 4,4'-[1-[4-[1-[4-hydroxylphenyl]-1-methylethyl]phenyl]ethylidene]bisphenol-1,2-naphthoquinone diazide-5-sulfonic acid ester as the 1,2-quinonediazide compound; and a nanowire structure; and, if necessary, further contains other components.

Next will be described the alkali-soluble polymer, each of the monomers, the 1,2-quinonediazide compound and the nanowire structure.

<Alkali-Soluble Polymer>

The alkali-soluble polymer is a polymer formed through copolymerization of a radical polymerizable monomer (A) represented by General Formula (I) or (II) and radical polymerizable monomer (B). That is, this alkali-soluble polymer is a copolymer formed through polymerization of a mixture of monomers. In the alkali-soluble polymer, preferably, the amount of monomer (A) represented by General Formula (I) or (II) is 1% by mass to 80% by mass, and the amount of the other radical polymerizable monomer is 20% by mass to 99% by mass.

The other radical polymerizable monomer (B) preferably contains no carboxyl group-containing radical polymerizable monomer. For example, preferably, the other radical polymerizable monomer (B) contains one or more selected from oxetanyl-containing radical polymerizable monomer (b1), oxyranyl-containing radical polymerizable monomer (b2) and hydroxyl group-containing radical polymerizable monomer (b3), or contains all monomers (b1) to (b3).

Next will be described compound (A) represented by General Formula (I) or (II) and the other radical polymerizable monomer (B) (which are referred to as "monomer A" and "monomer B," respectively).

In addition, next will be described specific monomers used as monomer B; i.e., oxetanyl-containing radical polymerizable monomer (b1), oxyranyl-containing radical polymerizable monomer (b2), hydroxyl group-containing radical polymerizable monomer (b3) and the other radical polymerizable monomer (b4) (which are referred to as "monomer b1," "monomer b2," "monomer b3" and "monomer b4," respectively).

—Monomer (A) Represented by General Formula (I) or (II)—

Monomer A represented by General Formula (I) or (II), used in the present invention, is produced as follows. Specifically, the hydroxyl group of tetrahydrofurfuryl alcohol is reacted with ε-caprolactone through addition reaction, and the resultant product was esterified through dehydration with acrylic acid or methacrylic acid. When the alkali-soluble polymer containing at least one selected from these radical polymerizable monomers is used, the photosensitive composition obtained has high dissolvability to an aqueous alkali solution during development (i.e., has high developability), attains easy formation of a patterned transparent conductive film, and has high solvent resistance, high waterproofness, high alkali resistance, high heat resistance, high transparency and high adhesion to a base.

The compound represented by General Formula (II) used may be a commercially available KAYARAD TC-110S (product of NIPPON KAYAKU Co., Ltd.) which is an acrylic acid ester compound represented by General Formula (II) in which each of $R^1$ and $R^2$ is a hydrogen atom and n=about 1.

In the polymerization for forming the alkali-soluble polymer contained in the positive-type photosensitive composition of the present invention, monomer A is preferably used in an amount of 0.5% by mass to 85% by mass, more preferably 1% by mass to 80% by mass, on the basis of the total mass of all the monomers. When monomer A is used in an amount falling within the above range, the amount of a carboxyl group-containing radical polymerizable monomer used for forming the alkali-soluble polymer can be considerably reduced or can be reduced to 0. As a result, a transparent formed from the positive-type photosensitive composition of the present invention can be improved in, for example, solvent resistance, waterproofness, alkali resistance, heat resistance and transparency.

—Oxetanyl-Containing Radical Polymerizable Monomer (b1)—

Oxetanyl-containing radical polymerizable monomer (b1), which is a specific example of monomer B used in the present invention, is not particularly limited, so long as the monomer contains such a functional group that allows it to serve as monomer B. For example, monomer (b1) is a monomer represented by the following General Formula (III) or (IV):

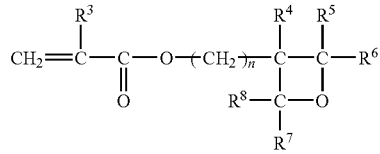

General Formula (III)

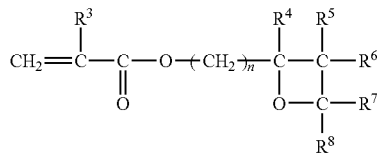

General Formula (IV)

in the General Formulas (III) and (IV), $R^3$ represents a hydrogen atom or a methyl group, $R^4$, $R^5$, $R^6$, $R^7$ and $R^8$ each independently represent a hydrogen atom, a C1 to C5 alkyl group, a C2 to C5 alkenyl group or a C2 to C5 alkynyl group, and n is an integer of 1 to 5.

The C1 to C5 alkyl group is a linear or branched alkyl group. Examples thereof include methyl, ethyl, propyl, n-butyl, t-butyl and pentyl.

The C2 to C5 alkenyl group is, for example, a linear or branched alkenyl group containing 1 to 3 double bonds. Specific examples thereof include ethenyl, 1-propenyl, 2-propenyl, 1-methylethenyl, 1-butenyl, 2-butenyl, 3-butenyl, 2-methyl-2-propenyl, 1-pentenyl, 2-pentenyl, 4-pentenyl and 3-methyl-2-butenyl.

The C2 to C5 alkynyl group is, for example, linear or branched alkynyl group containing 1 to 3 triple bonds. Specific examples thereof include ethynyl, 1-propynyl, 2-propynyl, 1-butynyl, 2-butynyl, 3-butynyl, 1-pentynyl, 2-pentynyl and 4-pentynyl.

Specific examples of monomer b1 include (3-methyl-3-oxetanyl)methyl (meth)acrylate, (3-ethyl-3-oxetanyl)methyl (meth)acrylate, (3-methyl-3-oxetanyl)ethyl(meth)acrylate, (3-ethyl-3-oxetanyl)ethyl(meth)acrylate, (2-methyl-2-oxetanyl)methyl(meth)acrylate, (2-ethyl-2-oxetanyl)methyl (meth)acrylate, p-vinylphenyl-3-ethyloxetan-3-yl methyl ether, 2-phenyl-3-(meth)acryloxymethyloxetane, 2-trifluoromethyl-3-(meth)acryloxymethyloxetane and 4-trifluoromethyl-2-(meth)acryloxymethyloxetane. These may be used individually or in combination.

When the alkali-soluble polymer containing at least one selected from these radical polymerizable monomers is used, the photosensitive composition obtained has high dissolvability to an aqueous alkali solution (i.e., has high developability), attains easy formation of a patterned transparent conductive film, and has high solvent resistance, high waterproofness, high alkali resistance, high heat resistance, high transparency and high adhesion to a base, which is preferred.

Among the above specific examples, (3-ethyl-3-oxetanyl) methyl (meth)acrylate and (2-ethyl-2-oxetanyl)methyl (meth)acrylate are particularly preferred, since these can be easily obtained and have high dissolvability to an aqueous alkali solution during development, and use of them requires no carboxyl group-containing radical polymerizable monomers. One monomer b1 can be used, or a mixture of two or more monomers b1 can be used.

In the polymerization for forming the alkali-soluble polymer contained in the positive-type photosensitive composition of the present invention, oxetanyl-containing radical polymerizable monomer (b1) is preferably used in an amount of 1% by mass to 80% by mass, more preferably 5% by mass to 30% by mass, on the basis of the total mass of all the monomers. When monomer b1 is used in an amount falling within the above range, the amount of a carboxyl group-containing radical polymerizable monomer used for forming the alkali-soluble polymer can be considerably reduced or can be reduced to 0. As a result, a transparent formed from the positive-type photosensitive composition of the present invention can be improved in, for example, solvent resistance, waterproofness, alkali resistance, heat resistance and transparency.

—Oxyranyl-Containing Radical Polymerizable Monomer (b2)—

Oxyranyl-containing radical polymerizable monomer (b2), which is a specific example of monomer B used in the present invention, is not particularly limited, so long as the monomer contains such a functional group that allows it to serve as monomer B.

For example, monomer b2 is glycidyl(meth)acrylate, methylglycidyl (meth)acrylate, α-ethylacrylic acid glycidyl ester and 3,4-epoxycyclohexyl (meth)acrylate.

Among the above specific examples, glycidyl acrylate, glycidyl methacrylate, methylglycidyl methacrylate and 3,4-epoxycyclohexyl methacrylate are particularly preferred, since these can be easily obtained, and the patterned transparent conductive film formed using them is improved in, for example, solvent resistance, waterproofness, alkali resistance, heat resistance and transparency.

One monomer b2 can be used, or a mixture of two or more monomers b2 can be used.

In the polymerization for forming the alkali-soluble polymer contained in the positive-type photosensitive composition of the present invention, oxyranyl-containing radical polymerizable monomer (b2) is preferably used in an amount of 5% by mass to 50% by mass, more preferably 10% by mass to 30% by mass, on the basis of the total mass of all the monomers. When monomer b2 is used in an amount falling within the above range, the amount of a carboxyl group-containing radical polymerizable monomer used for forming the alkali-soluble polymer can be considerably reduced or can be reduced to 0. As a result, a transparent formed from the positive-type photosensitive composition of the present invention can be improved in, for example, solvent resistance, waterproofness, alkali resistance, heat resistance and transparency.

—Hydroxyl Group-Containing Radical Polymerizable Monomer (b3)—

Hydroxyl group-containing radical polymerizable monomer (b3), which is a specific example of monomer B used in the present invention, is not particularly limited, so long as the monomer contains such a functional group that allows it to serve as monomer B.

For example, monomer b3 is hydroxylmethyl(meth)acrylate, 2-hydroxylethyl (meth)acrylate, 2-hydroxylpropyl (meth)acrylate, 3-hydroxylpropyl(meth)acrylate and 4-hydroxylbutyl(meth)acrylate.

Among the above specific examples, 2-hydroxylethyl acrylate, 2-hydroxylethyl methacrylate, 2-hydroxylpropyl acrylate and 2-hydroxylpropyl methacrylate are preferred, since these can be easily obtained and have high dissolvability to an aqueous alkali solution during development by virtue of the hydroxyl group, and use of them requires no carboxyl group-containing radical polymerizable monomers. One monomer b3 can be used, or a mixture of two or more monomers b3 can be used.

In the polymerization for forming the alkali-soluble polymer contained in the positive-type photosensitive composition of the present invention, hydroxyl group-containing radical polymerizable monomer (b3) is preferably used in an amount of 1% by mass to 60% by mass, more preferably 5% by mass to 50% by mass, on the basis of the total mass of all the monomers. When monomer b3 is used in an amount falling within the above range, the amount of a carboxyl group-containing radical polymerizable monomer used for forming the alkali-soluble polymer can be considerably reduced or can be reduced to 0. As a result, a transparent formed from the positive-type photosensitive composition of the present invention can be improved in, for example, solvent resistance, waterproofness, alkali resistance, heat resistance and transparency.

—Other Radical Polymerizable Monomer (b4)—

In the alkali-soluble polymer formed through copolymerization of monomer A and radical polymerizable monomer (B) (e.g., monomers b1, b2 and b3), considering process margin including developability as described above, the other radical polymerizable monomer (b4), in addition to monomers A, b1, b2 and b3, can be used in such an amount that the formed patterned transparent conductive film is not greatly affected in terms of, for example, solvent resistance, waterproofness, alkali resistance, heat resistance and transparency.

Examples of monomer b4 include styrene, methylstyrene, vinyltoluene, chloromethylstyrene, (meth)acrylamide, tricyclo[5.2.1.0(2,6)]decanyl(meth)acrylate, dicyclopentenyl (meth)acrylate, dicyclopentenyloxyethyl(meth)acrylate, benzyl (meth)acrylate, isobornyl(meth)acrylate, (meth) acrylic acid, methyl(meth)acrylate, ethyl(meth)acrylate, cyclohexyl(meth)acrylate, butyl(meth)acrylate, phenyl (meth)acrylate, glycerol mono(meth)acrylate, maleic anhydride, itaconic anhydride, N-phenylmeleimide, polystyrene macromonomers, polymethyl methacrylate macromonomers, N-acryloyl morpholine and indene. These may be used individually or in combination.

Among the above specific examples, the positive-type photosensitive composition containing an alkali-soluble polymer formed by copolymerizing with the other monomers at least one selected from styrene, methyl(meth)acrylate, ethyl (meth)acrylate, benzyl(meth)acrylate, cyclohexyl(meth) acrylate, tricyclo[5.2.1.0(2,6)]decanyl(meth)acrylate, N-phenylmaleimide and polystyrene macromonomers is preferred, since it has excellent developability and quite high solvent resistance, waterproofness, alkali resistance, heat resistance and transparency.

In the polymerization for forming the alkali-soluble polymer contained in the positive-type photosensitive composition of the present invention, monomer b4 is preferably used in an amount of 10% by mass or less, more preferably 4% by mass or less, on the basis of the total mass of all the monomers.

Also, monomer b4 preferably contains a carboxyl group-containing radical polymerizable monomer in an amount of 4% by mass or less on the basis of the total mass of the all the monomers, more preferably contains no carboxyl group-containing radical polymerizable monomer.

—Polymerizing Method for Alkali-Soluble Polymer—

The alkali-soluble polymer can be formed through polymerization of a mixture of monomer (A) and monomer (B).

The polymerizing method for the alkali-soluble polymer is not particularly limited, but preferred is radical polymerization in a solution using a solvent. The polymerization temperature is not particularly limited, so long as a sufficient amount of radicals are generated from a polymerization initiator used. Preferably, the polymerization temperature is 50° C. to 150° C. The polymerization time is not particularly limited but is a range of 3 hours to 24 hours. The polymerization can be performed under any pressure; i.e., under increased pressure, reduced pressure or atmospheric pressure.

The solvent used in the polymerization reaction is preferably a solvent capable of dissolving monomers A and B for forming the alkali-soluble polymer.

The solvent is not particularly limited and may be appropriately selected depending on the purpose. Examples thereof include methanol, ethanol, 1-propanol, 2-propanol, acetone, 2-butanone, ethyl acetate, propyl acetate, tetrahydrofuran, acetonitrile, dioxane, toluene, xylene, cyclohexanone, ethylene glycol monoethyl ether, propylene glycol monomethyl ether, propylene glycol monomethyl ether acetate, diethylene glycol dimethyl ether, diethylene glycol methyl ethyl ether, methyl 3-methoxypropionate, ethyl 3-ethoxypropionate, N,N-dimethylformamide, acetic acid and water. These may be used individually or in combination.

The polymerization initiator used for synthesizing the alkali-soluble polymer may be, for example, compounds capable of generating radicals by heat, azo-based initiators (e.g., azobisisobutylonitrile) and peroxide-based initiators (e.g., benzoyl peroxide). For adjusting the molecular weight, a chain transfer agent (e.g., thioglycolic acid) may be added in an appropriate amount.

When the alkali-soluble polymer has a weight average molecular weight (converted to polyethylene oxide (standard)) of 1,000 to 100,000 which is measured through GPC analysis, the photosensitive composition has an appropriate developing time required until the exposed portions are dissolved by an alkali developer, and the film surface is not easily roughed during development, which is preferred. Further, when the alkali-soluble polymer has a weight average molecular weight of 1,500 to 50,000, the photosensitive composition has an appropriate developing time required the unexposed portions are dissolved by an alkali developer, the film surface is not easily roughed during development, and the residue after development is extremely reduced, which is more preferred. For the same reasons, it is particularly preferred that the alkali-soluble polymer has a weight average molecular weight of 2,000 to 20,000.

The amount of the alkali-soluble polymer contained in the positive-type photosensitive composition is preferably 0.01% by mass to 90% by mass, more preferably 0.1% by mass to 85% by mass.

Use of the alkali-soluble polymer in an amount falling within the above range is preferred from the viewpoint of attaining desired developability and desired conductivity at the same time.

<1,2-Quinonediazide Compound>

Examples of the 1,2-quinonediazide compound include 1,2-benzoquinonediazide sulfonic acid ester, 1,2-naphthoquinonediazide sulfonic acid ester, 1,2-benzoquinonediazide sulfonamide and 1,2-naphthoquinonediazide sulfonamide. These may be used individually or in combination.

Examples of the 1,2-benzoquinonediazide sulfonic acid ester include 2,3,4-trihydroxylbenzophenone-1,2-benzoquinonediazide-4-sulfonic acid ester, 2,3,4-trihydroxylbenzophenone-1,2-benzoquinonediazide-5-sulfonic acid ester, 2,4,6-trihydroxylbenzophenone-1,2-benzoquinonediazide-4-sulfonic acid ester, 2,4,6-trihydroxylbenzophenone-1,2-benzoquinonediazide-5-sulfonic acid ester, 2,2',4,4'-tetrahydroxylbenzophenone-1,2-benzoquinonediazide-4-sulfonic acid ester, 2,2',4,4'-tetrahydroxylbenzophenone-1,2-benzoquinonediazide-5-sulfonic acid ester, 2,3,3',4-tetrahydroxylbenzophenone-1,2-benzoquinonediazide-4-sulfonic acid ester, 2,3,3',4-tetrahydroxylbenzophenone-1,2-benzoquinonediazide-5-sulfonic acid ester, 2,3,4,4'-tetrahydroxylbenzophenone-1,2-benzoquinonediazide-4-sulfonic acid ester, 2,3,4,4'-tetrahydroxylbenzophenone-1,2-benzoquinonediazide-5-sulfonic acid ester, bis(2,4-dihydroxylphenyl)methane-1,2-benzoquinonediazide-4-sulfonic acid ester, bis(2,4-dihydroxylphenyl)methane-1,2-benzoquinonediazide-5-sulfonic acid ester, bis(p-hydroxylphenyl)methane-1,2-benzoquinonediazide-4-sulfonic acid ester, bis(p-hydroxylphenyl)methane-1,2-benzoquinonediazide-5-sulfonic acid ester, tri(p-hydroxylphenyl)methane-1,2-benzoquinonediazide-4-sulfonic acid ester, tri(p-hydroxylphenyl)methane-1,2-benzoquinonediazide-5-sulfonic acid ester, 1,1,1-tri(p-hydroxylphenyl)ethane-1,2-benzoquinonediazide-4-sulfonic acid ester, 1,1,1-tri(p-hydroxylphenyl)ethane-1,2-benzoquinonediazide-5-sulfonic acid ester, bis(2,3,4-trihydroxylphenyl)methane-1,2-benzoquinonediazide-4-sulfonic acid ester, bis(2,3,4-trihydroxylphenyl)methane-1,2-benzoquinonediazide-5-sulfonic acid ester, 2,2-bis(2,3,4-trihydroxylphenyl)propane-1,2-benzoquinonediazide-4-sulfonic acid ester, 2,2-bis(2,3,4-trihydroxylphenyl)propane-1,2-benzoquinonediazide-5-sulfonic acid ester, 1,1,3-tris(2,5-dimethyl-4-hydroxylphenyl)-3-phenylpropane-1,2-benzoquinonediazide-4-sulfonic acid ester, 1,1,3-tris(2,5-dimethyl-4-hydroxylphenyl)-3-phenylpropane-1,2-benzoquinonediazide-5-sulfonic acid ester, 4,4'-[1-[4-[1-[4-hydroxylphenyl]-1-methylethyl]phenyl]ethylidene]bisphenol-1,2-benzoquinonediazide-4-sulfonic acid ester, 4,4'-[1-[4-[1-[4-hydroxylphenyl]-1-methylethyl]phenyl]ethylidene]bisphenol-1,2-benzoquinonediazide-5-sulfonic acid ester, bis(2,5-dimethyl-4-hydroxylphenyl)-2-hydroxylphenylmethane-1,2-benzoquinonediazide-4-sulfonic acid ester, bis(2,5-dimethyl-4-hydroxylphenyl)-2-hydroxylphenylmethane-1,2-benzoquinonediazide-5-sulfonic acid ester, 3,3,3',3'-tetramethyl-1,1'-spirobiindene-5,6,7,5',6',7'-hexanol-1,2-benzoquinonediazide-4-sulfonic acid ester, 3,3,3',3'-tetramethyl-1,1'-spirobiindene-5,6,7,5',6',7'-hexanol-1,2-benzoquinonediazide-5-sulfonic acid ester, 2,2,4-trimethyl-7,2',4'-trihydroxylflavan-1,2-benzoquinonediazide-4-sulfonic acid ester and 2,2,4-trimethyl-7,2',4'-trihydroxylflavan-1,2-benzoquinonediazide-5-sulfonic acid ester. These may be used individually or in combination.

Examples of the 1,2-naphthoquinone diazidesulfonic acid ester include 2,3,4-trihydroxylbenzophenone-1,2-naphthoquinone diazide-4-sulfonic acid ester, 2,3,4-trihydroxylbenzophenone-1,2-naphthoquinone diazide-5-sulfonic acid ester, 2,4,6-trihydroxylbenzophenone-1,2-naphthoquinone diazide-4-sulfonic acid ester, 2,4,6-trihydroxylbenzophenone-1,2-naphthoquinone diazide-5-sulfonic acid ester, 2,2',4,4'-tetrahydroxylbenzophenone-1,2-naphthoquinone diazide-4-sulfonic acid ester, 2,2',4,4'-tetrahydroxylbenzophenone-1,2-naphthoquinone diazide-5-sulfonic acid ester, 2,3,3',4-tetrahydroxylbenzophenone-1,2-naphthoquinone diazide-4-sulfonic acid ester, 2,3,3',4-tetrahydroxylbenzophenone-1,2-naphthoquinone diazide-5-sulfonic acid ester, 2,3,4,4'-tetrahydroxylbenzophenone-1,2-naphthoquinone diazide-4-sulfonic acid ester, 2,3,4,4'-tetrahydroxylbenzophenone-1,2-naphthoquinone diazide-5-sulfonic acid ester, bis(2,4-dihydroxylphenyl)methane-1,2-naphthoquinone diazide-4-sulfonic acid ester, bis(2,4-dihydroxylphenyl)methane-1,2-naphthoquinone diazide-5-sulfonic acid ester, bis(p-hydroxylphenyl)methane-1,2-naphthoquinone diazide-4-sulfonic acid ester, bis(p-hydroxylphenyl)methane-1,2-naphthoquinone diazide-5-sulfonic acid ester, tri(p-hydroxylphenyl)methane-1,2-naphthoquinone diazide-4-sulfonic acid ester, tri(p-hydroxylphenyl)methane-1,2-naphthoquinone diazide-5-sulfonic acid ester, 1,1,1-tri(p-hydroxylphenyl)ethane-1,2-naphthoquinone diazide-4-sulfonic acid ester, 1,1,1-tri(p-hydroxylphenyl)ethane-1,2-naphthoquinone diazide-5-sulfonic acid ester, bis(2,3,4-trihydroxylphenyl)methane-1,2-naphthoquinone diazide-4-sulfonic acid ester, bis(2,3,4-trihydroxylphenyl)methane-1,2-naphthoquinone diazide-5-sulfonic acid ester, 2,2-bis(2,3,4-trihydroxylphenyl)propane-1,2-naphthoquinone diazide-4-sulfonic acid ester, 2,2-bis(2,3,4-trihydroxylphenyl)propane-1,2-naphthoquinone diazide-5-sulfonic acid ester, 1,1,3-tris(2,5-dimethyl-4-hydroxylphenyl)-3-phenylpropane-1,2-naphthoquinone diazide-4-sulfonic acid ester, 1,1,3-tris(2,5-dimethyl-4-hydroxylphenyl)-3-phenylpropane-1,2-naphthoquinone diazide-5-sulfonic acid ester, 4,4'-[1-[4-[1-[4-hydroxylphenyl]-1-methylethyl]phenyl]ethylidene]bisphenol-1,2-naphthoquinone diazide-4-sulfonic acid ester, 4,4'-[1-[4-[1-[4-hydroxylphenyl]-1-methylethyl]phenyl]ethylidene]bisphenol-1,2-naphthoquinone diazide-5-sulfonic acid ester, bis(2,5-dimethyl-4-hydroxylphenyl)-2-hydroxylphenylmethane-1,2-naphthoquinone diazide-4-sulfonic acid ester, bis(2,5-dimethyl-4-hydroxylphenyl)-2-hydroxylphenylmethane-1,2-naphthoquinone diazide-5-sulfonic acid ester, 3,3,3',3'-tetramethyl-1,1'-spirobiindene-5,6,7,5',6',7'-hexanol-1,2-naphthoquinone diazide-4-sulfonic acid ester, 3,3,3',3'-tetramethyl-1,1'-spirobiindene-5,6,7,5',6',7'-hexanol-1,2-naphthoquinone diazide-5-sulfonic acid ester, 2,2,4-trimethyl-7,2',4'-trihydroxylflavan-1,2-naphthoquinone diazide-4-sulfonic acid ester and 2,2,4-trimethyl-7,2',4'-trihydroxylflavan-1,2-naphthoquinone diazide-5-sulfonic acid ester. These may be used individually or in combination.

Examples of the 1,2-benzoquinonediazide sulfonamide include 2,3,4-trihydroxylbenzophenone-1,2-benzoquinonediazide-4-sulfonamide, 2,3,4-trihydroxylbenzophenone-1,2-benzoquinonediazide-5-sulfonamide, 2,4,6-trihydroxylbenzophenone-1,2-benzoquinonediazide-4-sulfonamide, 2,4,6-trihydroxylbenzophenone-1,2-benzoquinonediazide-5-sulfonamide, 2,2',4,4'-tetrahydroxylbenzophenone-1,2-benzoquinonediazide-4-sulfonamide, 2,2',4,4'-tetrahydroxylbenzophenone-1,2-benzoquinonediazide-5-sulfonamide, 2,3,3',4-tetrahydroxylbenzophenone-1,2-benzoquinonediazide-4-sulfonamide, 2,3,3',4-tetrahydroxylbenzophenone-1,2-benzoquinonediazide-5-sulfonamide, 2,3,4,4'-tetrahydroxylbenzophenone-1,2-benzoquinonediazide-4-sulfonamide, 2,3,4,4'-tetrahydroxylbenzophenone-1,2-benzoquinonediazide-5-sulfonamide, bis(2,4- dihydroxylphenyl)methane-1,2-benzoquinonediazide-4-sulfonamide, bis(2,4-dihydroxylphenyl)methane-1,2-benzoquinonediazide-5-sulfonamide, bis(p-hydroxylphenyl)methane-1,2-benzoquinonediazide-4-sulfonamide, bis(p-hydroxylphenyl)methane-1,2-benzoquinonediazide-5-sulfonamide, tri(p-hydroxylphenyl)methane-1,2-benzoquinonediazide-4-sulfonamide, tri(p-hydroxylphenyl)methane-1,2-benzoquinonediazide-5-sulfonamide, 1,1,1-tri(p-hydroxylphenyl)ethane-1,2-benzoquinonediazide-4-sulfonamide, 1,1,1-tri(p-hydroxylphenyl)ethane-1,2-benzoquinonediazide-5-sulfonamide, bis(2,3,4-trihydroxylphenyl)methane-1,2-benzoquinonediazide-4-sulfonamide, bis(2,3,4-trihydroxylphenyl)methane-1,2-benzoquinonediazide-5-sulfonamide, 2,2-bis(2,3,4-trihydroxylphenyl)propane-1,2-benzoquinonediazide-4-sulfonamide, 2,2-bis(2,3,4-trihydroxylphenyl)propane-1,2-benzoquinonediazide-5-sulfonamide, 1,1,3-tris(2,5-dimethyl-4-hydroxylphenyl)-3-phenylpropane-1,2-benzoquinonediazide-4-sulfonamide, 1,1,3-tris(2,5-dimethyl-4-hydroxylphenyl)-3-phenylpropane-1,2-benzoquinonediazide-5-sulfonamide, 4,4'-[1-[4-[1-[4-hydroxylphenyl]-1-methylethyl]phenyl]ethylidene]bisphenol-1,2-benzoquinonediazide-4-sulfonamide, 4,4'-[1-[4-[1-[4-hydroxylphenyl]-1-methylethyl]phenyl]ethylidene]bisphenol-1,2-benzoquinonediazide-5-sulfonamide, bis(2,5-dimethyl-4-hydroxylphenyl)-2-hydroxylphenylmethane-1,2-benzoquinonediazide-4-sulfonamide, bis(2,5-dimethyl-4-hydroxylphenyl)-2-hydroxylphenylmethane-1,2-benzoquinonediazide-5-sulfonamide, 3,3,3',3'-tetramethyl-1,1'-spirobiindene-5,6,7,5',6',7'-hexanol-1,2-benzoquinonediazide-4-sulfonamide, 3,3,3',3'-tetramethyl-1,1'-spirobiindene-5,6,7,5',6',7'-hexanol-1,2-benzoquinonediazide-5-sulfonamide, 2,2,4-trimethyl-7,2',4'-trihydroxylflavan-1,2-benzoquinonediazide-4-sulfonamide and 2,2,4-trimethyl-7,2',4'-trihydroxylflavan-1,2-benzoquinonediazide-5-sulfonamide. These may be used individually or in combination.

Examples of the 1,2-naphthoquinone diazidesulfonamide include 2,3,4-trihydroxylbenzophenone-1,2-naphthoquinone diazide-4-sulfonamide, 2,3,4-trihydroxylbenzophenone-1,2-naphthoquinone diazide-5-sulfonamide, 2,4,6-trihydroxylbenzophenone-1,2-naphthoquinone diazide-4-sulfonamide, 2,4,6-trihydroxylbenzophenone-1,2-naphthoquinone diazide-5-sulfonamide, 2,2',4,4'-tetrahydroxylbenzophenone-1,2-naphthoquinone diazide-4-sulfonamide, 2,2',4,4'-tetrahydroxylbenzophenone-1,2-naphthoquinone diazide-5-sulfonamide, 2,3,3',4-tetrahydroxylbenzophenone-1,2-naphthoquinone diazide-4-sulfonamide, 2,3,3',4-tetrahydroxylbenzophenone-1,2-naphthoquinone diazide-5-sulfonamide, 2,3,4,4'-tetrahydroxylbenzophenone-1,2-naphthoquinone diazide-4-sulfonamide, 2,3,4,4'-tetrahydroxylbenzophenone-1,2-naphthoquinone diazide-5-sulfonamide, bis(2,4-dihydroxylphenyl)methane-1,2-naphthoquinone diazide-4-sulfonamide, bis(2,4-dihydroxylphenyl)methane-1,2-naphthoquinone diazide-5-sulfonamide, bis(p-hydroxylphenyl)methane-1,2-naphthoquinone diazide-4-sulfonamide, bis(p-hydroxylphenyl)methane-1,2-naphthoquinone diazide-5-sulfonamide, tri(p-hydroxylphenyl)methane-1,2-naphthoquinone diazide-4-sulfonamide, tri(p-hydroxylphenyl)methane-1,2-naphthoquinone diazide-5-sulfonamide, 1,1,1-tri(p-hydroxylphenyl)ethane-1,2-naphthoquinone diazide-4-sulfonamide, 1,1,1-tri(p-hydroxylphenyl)ethane-1,2-naphthoquinone diazide-5-sulfonamide, bis(2,3,4-trihydroxylphenyl)methane-1,2-naphthoquinone diazide-4-sulfonamide, bis(2,3,4-trihydroxylphenyl)methane-1,2-naphthoquinone diazide-5-sulfonamide, 2,2-bis(2,3,4-trihydroxylphenyl)propane-1,2-naphthoquinone diazide-4-sulfonamide, 2,2-bis(2,3,4-trihydroxylphenyl)propane-1,2-naphthoquinone diazide-5-sulfonamide, 1,1,3-tris(2,5-dimethyl-4-hydroxylphenyl)-3-phenylpropane-1,2-naphthoquinone diazide-4-sulfonamide, 1,1,3-tris(2,5-dimethyl-4-hydroxylphenyl)-3-phenylpropane-1,2-naphthoquinone diazide-5-sulfonamide, 4,4'-[1-[4-[1-[4-hydroxylphenyl]-1-methylethyl]phenyl]ethylidene]bisphenol-1,2-naphthoquinone diazide-4-sulfonamide, 4,4'-[1-[4-[1-[4-hydroxylphenyl]-1-methylethyl]phenyl]ethylidene]bisphenol-1,2-naphthoquinone diazide-5-sulfonamide, bis(2,5-dimethyl-4-hydroxylphenyl)-2-hydroxylphenylmethane-1,2-naphthoquinone diazide-4-sulfonamide, bis(2,5-dimethyl-4-hydroxylphenyl)-2-hydroxylphenylmethane-1,2-naphthoquinone diazide-5-sulfonamide, 3,3,3',3'-tetramethyl-1,1'-spirobiindene-5,6,7,5',6',7'-hexanol-1,2-naphthoquinone diazide-4-sulfonamide, 3,3,3',3'-tetramethyl-1,1'-spirobiindene-5,6,7,5',6',7'-hexanol-1,2-naphthoquinone diazide-5-sulfonamide, 2,2,4-trimethyl-7,2',4'-trihydroxylflavan-1,2-naphthoquinone diazide-4-sulfonamide and 2,2,4-trimethyl-7,2',4'-trihydroxylflavan-1,2-naphthoquinone diazide-5-sulfonamide. These may be used individually or in combination.

In particular, at least one selected from 2,3,4-trihydroxylbenzophenone-1,2-naphthoquinone diazide-4-sulfonic acid ester, 2,3,4-trihydroxybenzophenone-1,2-naphthoquinone diazide-5-sulfonic acid ester, 4,4'-[1-[4-[1-[4-hydroxylphenyl]-1-methylethyl]phenyl]ethylidene]bisphenol-1,2-naphthoquinone diazide-4-sulfonic acid ester and 4,4'-[1-[4-[1-[4-hydroxylphenyl]-1-methylethyl]phenyl]ethylidene]bisphenol-1,2-naphthoquinone diazide-5-sulfonic acid ester is particularly preferably used as the 1,2-quinonediazide compound, since the formed positive-type photosensitive composition is increased in transparency.

The amount of the 1,2-quinonediazide compound contained in the positive-type photosensitive composition is preferably 1 part by mass to 100 parts by mass, more preferably 3 parts by mass to 80 parts by mass, with respect to 100 parts by mass of the alkali-soluble polymer.

When the amount thereof is less than 1 part by mass, the amount of acids generated through exposure is small. Thus, the coated film formed from the composition may be difficult to pattern, since the difference in dissolvability to a developer between exposed portions and unexposed portions becomes small. Whereas when the amount thereof is more than 100 parts by mass, the 1,2-quinonediazide compound is not sufficiently decomposed to remain when irradiated to light for a short time, potentially leading to a drop in sensitivity.

<Nanowire Structure>

The nanowire structure is not particularly limited, so long as it has conductivity and a nanowire structure, and may be appropriately selected depending on the purpose. Examples thereof include metal oxides such as ITO, zinc oxide and tin oxide; carbon nanotubes, elemental metals, core-shell structures formed of a plurality of metal elements, alloys and plated metal nanowires, with metal nanowires and carbon nanotubes being preferred, with metal nanowires being particularly preferred.

In the present invention, the nanowire structure refers to a structure having an aspect ratio (major axis length/minor axis length) of 30 or greater.

—Carbon Nanotube—

Carbon nanotubes are a tubular carbon structure formed of elongated carbon fibers each having a diameter of 1 nm to 1,000 nm, a length of 0.1 μm to 1,000 μm, and an aspect ratio of 100 to 10,000.

Known methods for producing carbon nanotubes include an arc-discharge method, a laser evaporation method, a thermal CVD method and a plasma CVD method. Carbon nanotubes formed by the arc-discharge method and laser evaporation method are classified into single wall nanotubes (SWNTs) formed of only one graphene sheet and multi wall nanotubes (MWNTs) formed of a plurality of graphene sheets.

The thermal CVD method and plasma CVD method can produce MWNTs mainly. The SWNTs have a tubular structure formed by curling one graphene sheet in which carbon atoms are hexagonally bonded to one another via strong bonds called an SP2 bond.

Carbon nanotubes (SWNTs or MWNTs) are a tubular substance having a structure formed by curling one to several graphene sheets, and having a diameter of 0.4 nm to 10 nm and a length of 0.1 μm to several hundreds micrometers. Depending on the direction in which the graphene sheet(s) is(are) curled, the formed carbon nanotubes have unique properties that they become a metal or semiconductor.

—Metal Nanowire—

The diameter (minor axis length) of the metal nanowire is preferably 300 nm or less, more preferably 200 nm or less, yet more preferably 100 nm or less. When the diameter thereof is too small, the antioxidation property thereof is degraded, potentially degrading the durability of the metal nanowire. Therefore, the diameter of the metal nanowire is preferably 5 nm or more. When the diameter thereof is more than 300 nm, there may be cases where sufficient transparency cannot be attained, probably because scattering occurs due to the metal nanowires.

The length (major axis length) of the metal nanowire is preferably 5 μm or more, more preferably 15 μm or more, yet more preferably 25 μm or more. When the major axis length of the metal nanowire is too long, aggregated matters may be generated during the production process, probably because the metal nanowires are tangled each other. Therefore, the major axis length of the metal nanowire is preferably 1 mm or less, more preferably 500 μm or less. When the major axis length of the metal nanowire is less than 5 μm, sufficient conductivity may not be attained probably because it is difficult to form a dense network.

Here, the diameter and major axis length of the metal nanowire can be obtained, for example, by using a transmission electron microscope (TEM) and an optical microscope, and observing images of TEM or the optical microscope. In the present invention, the diameter and major axis length of the metal nanowire are obtained by observing three hundred metal nanowires by means of a transmission electron microscope (TEM), and calculating the average values thereof.

In the present invention, the metal nanowires each having a diameter of 50 nm or less and a major axis length of 5 μm or more are contained in the total metal particles preferably in an amount of 50% by mass or more, more preferably 60% by mass or more, yet more preferably 75% by mass or more on the basis of the metal content.

When the proportion of the metal nanowires each having a diameter of 50 nm or less and a major axis length of 5 μm or more (hereinafter, may be referred as an appropriate wire yield) is less than 50% by mass, the conductivity may be lowered probably because the metal content contributing to the conductivity is reduced, and the durability may be degraded probably because a dense wire network cannot be formed at the same time to thereby cause a voltage concentration. Moreover, in the case where the plasmon absorption of particles having the shape other than the nanowire is strong, such as the case of spherical particles, the transparency may be degraded.

Here, the appropriate wire yield can be obtained, for example when the metal nanowire is a silver nanowire, by filtering silver nanowire aqueous solution so as to separate the silver nanowires from the other particles, and measuring the amount of Ag remained on the filter paper, and the amount of Ag passed through the filter paper, respectively, by means of ICP Atomic Emission Spectrometer. The metal nanowires remained on the filter paper are observed under a TEM, among them the diameters of the three hundred metal nanowires are observed, and check the distribution thereof, to thereby confirm that they are the metal nanowires having a diameter of 50 nm or less and a major axis length of 5 μm or more. Note that, as the filter paper, those having a pore size which is five times or more of the maximum major axis length of particles other than the metal nanowires each having a diameter of 50 nm or less and a major axis length of 5 μm or more measured through TEM, and which is ½ or less of the minimum major axis length of the metal nanowires are preferably used.

The variation coefficient of the diameters of the metal nanowires is preferably 40% or less, more preferably 35% or less, yet more preferably 30% or less.

When the variation coefficient is more than 40%, the durability may be degraded probably because the voltage is concentrated on wires having small diameters.

The variation coefficient of the diameters of the metal nanowires can be obtained, for example, by measuring diameters of three hundred metal nanowires on an image of transmission electron microscope (TEM), and calculating the standard deviation and average value thereof.

The shape of the metal nanowires may be any shape such as a cylindrical columnar shape, a rectangular parallelepiped shape, and a columnar shape with a polygonal cross-section. When high transparency is required in their use, the shape of the metal nanowires is preferably a cylindrical columnar shape or a columnar shape with a polygonal cross-section having round corners.

The shape of cross-section of the metal nanowires may be confirmed as follows. Specifically, a water dispersion of the metal nanowires is applied on a substrate, and their cross-sections are observed under a transmission electron microscope (TEM).

A corner of the cross-section of the metal nanowires means a part around an intersection point of the two extended straight lines from the neighboring sides of the cross-section. "Side of the cross-section" means a straight line segment connecting two neighboring corners of the cross-section. Here, a "degree of sharpness" is defined as a percentage of "the length of the periphery of the cross-section" to the total length of all "sides of the cross-section." For example, in a cross-section of a metal nanowire shown in FIG. 1, the degree of sharpness can be expressed as a percentage of the length of the periphery of the cross-section indicated by a solid curving line to the length of the periphery of a pentagon indicated by dotted straight line segments. The shape of a cross-section having a degree of sharpness of 75% or less is defined as the shape of the "cross-section having round corners." The degree of the cross section is preferably 60% or less, more preferably 50% or less. When the degree of sharpness is more than 75%, the transparency may be degraded with a remaining yellowish color, probably because electrons are localized in the corners to enhance plasmon absorption.

A metal used for the metal nanowires is not particularly limited in terms of the selection thereof, and any metal can be used for the metal nanowires. In addition to using one metal, two or more metals may be used in combination, or as an alloy. Among them, those formed of a metal or a metal compound are preferable, and those formed of a metal are more preferable.

The metal is preferably at least one metal selected from the $4^{th}$, $5^{th}$ and $6^{th}$ periods of the long form of Periodic Table (IUPAC 1991), more preferably from the $2^{nd}$ to $14^{th}$ groups thereof, and yet more preferably from the $2^{nd}$ group, the $8^{th}$ group, $9^{th}$ group, $10^{th}$ group, $11^{th}$ group, $12^{th}$ group, $13^{th}$ group and $14^{th}$ group. Moreover, it is particularly preferred that at least one of the aforementioned elements be contained in the metal as a main component.

Examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead and alloys thereof. Among them, copper, silver, gold, platinum, palladium, nickel, tin, cobalt, rhodium, iridium and alloys thereof are preferable, palladium, copper, silver, gold, platinum, tin and alloys thereof are more preferable, and silver and alloy containing silver are particularly preferable.

—Production Method for Metal Nanowire—

The method for producing the metal nanowires is not particularly limited and may be any method. Preferably, as described below, the metal nanowires are produced by reducing metal ions in a solvent containing a halogen compound and a dispersing agent.

As the solvent, a hydrophilic solvent is preferable. Examples of the hydrophilic solvent include: water; alcohols such as methanol, ethanol, propanol, isopropanol, butanol and ethylene glycol; ethers such as dioxane and tetrahydrofuran; and ketenes such as acetone.

The heating temperature is preferably 250° C. or less, more preferably 20° C. to 200° C., yet more preferably 30° C. to 180° C., particularly preferably 40° C. to 170° C. If necessary, the temperature may be changed during the formation of particles. To change the temperature in the course of the formation of particles may contribute to the control for the formation of the core, preventing the generation of re-grown cores and promoting selective growth to improve the monodispersibility.

When the heating temperature is more than 250° C., the transmittance may be lowered in terms of the evaluation of the coated film, probably because the angles of the cross section of the metal nanowire become sharp. Moreover, as the heating temperature is getting lower, the metal nanowires tends to tangle and dispersion stability thereof is lowered, probably because the yield of core formation is lowered and the metal nanowires become too long. This tendency becomes significant at the heating temperature of 20° C. or less.

It is preferred that the reducing agent be added at the time of the heating. The reducing agent is suitably selected from those generally used without any restriction. Examples of the reducing agent include: metal salts of boron hydrides such as sodium boron hydride and potassium boron hydride; aluminum hydride salts such as lithium aluminum hydride, potassium aluminum hydride, cesium aluminum hydride, beryllium aluminum hydride, magnesium aluminum hydride and calcium aluminum hydride; sodium sulfite; hydrazine compounds; dextrin; hydroquinones; hydroxylamines; citric acid and salts thereof; succinic acid and salts thereof; ascorbic acid and salts thereof; alkanol amines such as diethylamino ethanol, ethanol amine, propanol amine, triethanol amine and dimethylamino propanol; aliphatic amines such as propyl amine, butyl amine, dipropylene amine, ethylene diamine and triethylenepentamine; heterocyclic amines such as piperidine, pyrrolidine, N-methylpyrrolidine and morpholine; aromatic amines such as aniline, N-methyl aniline, toluidine, anisidine and phenetidine; aralkyl amines such as benzyl amine, xylene diamine and N-methylbenzyl amine; alcohols such as methanol, ethanol and 2-propanol; ethylene glycol; glutathione; organic acids such as citric acid, malic acid and tartaric acid; reducing sugars such as glucose, galactose, mannose, fructose, sucrose, maltose, raffinose and stachyose; and sugar alcohols such as sorbitol. Among them, the reducing sugars, sugar alcohols that are derivatives of the reducing sugars, and ethylene glycol are particularly preferable.

Note that, there is a case where the reducing agents may also function as a dispersing agent or a solvent depending on the types of the reducing agents, and those reducing agents are also preferably used.

The timing when the reducing agent is added may be before or after addition of a dispersing agent, and may be before or after addition of a halogen compound or halogenated metal fine particles.

The metal nanowires are preferably produced through addition of a dispersing agent and a halogen compound or halogenated metal fine particles.

The timing when the dispersing agent and halogen compound are added may be before or after addition of the reducing agent, and may be before or after addition of the metal ions or halogenated metal fine particles. For producing nanowires having better monodispersibility, the halogen compound is preferably added twice or more times in a divided manner, probably because core formation and growth can be controlled.

The timing when the dispersing agent is added may be before preparation of particles in the presence of dispersion polymer, or after preparation of particles for controlling the dispersion state of the particles. In the case where the addition of the dispersing agent is carried out twice or more times, the amount of the dispersion agent to be added each time needs to be adjusted depending on the desired length (major axis length) of wires. This is because it is considered that the length of wires depends on the control of the amount of the metal particles serving as cores.

Examples of the dispersing agent include amino group-containing compounds, thiol group-containing compounds, sulfide group-containing compounds, amino acids or derivatives thereof, peptide compounds, polysaccharides, natural polymers derived from polysaccharides, synthetic polymers, and polymers derived from those mentioned above such as gels.

Examples of the polymers include protective colloid polymers such as gelatin, polyvinyl alcohol, methyl cellulose, hydroxypropyl cellulose, polyalkylene amine, partial alkyl ester of polyacrylic acid, polyvinyl pyrrolidone and polyvinyl-pyrrolidine copolymer.

The compound structures usable for the dispersing agent can be, for example, referred to the description in "Pigment Dictionary" (edited by Seishiro Ito, published by ASAKURA PUBLISHING CO., (2000)).

Depending on the type of the dispersing agent for use, the shapes of obtained metal nanowires can be changed.

The halogen compound is suitably selected depending on the intended purpose without any restriction, provided that the compound contains bromine, chlorine, or iodine. Preferable examples of the halogen compound include: alkali halide such as sodium bromide, sodium chloride, sodium iodide, potassium bromide, potassium chloride and potassium iodide; and compounds that can be used together with the dispersing agent described below. The timing when the halogen compound is added may be before or after addition of the dispersing agent, and before or after addition of the reducing agent.

Note that, there may be a case where the halogen compounds may also function as a dispersing agent depending on the types of the halogen compounds, and those halogen compounds are also preferably used.

Halogenated silver fine particles may be used instead of the halogen compound, or the halogen compound and the halogenated silver fine particles may be used in combination.

The single compound may be used as the dispersing agent and the halogen compound or halogenated silver fine particles. The compound used for both the dispersing agent and the halogen compound is, for example, hexadecyl-trimethylammonium bromide (HTAB) containing an amino group and a bromide ion, or hexadecyl-trimethylammonium chloride (HTAC) containing an amino group and a chloride ion.

The desalination can be carried out by ultrafiltration, dialysis, gel filtration, decantation, centrifugal separation, or the like, after formation of the metal nanowires.

It is preferred that the metal nanowires do not contain inorganic ions such as alkali metal ions, alkaline earth metal ions and halide ions to the greatest extent possible. The electric conductivity of an aqueous dispersion which has been prepared by dispersing the metal nanowires in pure water is preferably 1 mS/cm or less, more preferably 0.1 mS/cm or less, yet more preferably 0.05 mS/cm or less.

The viscosity of an aqueous dispersion which has been prepared by dispersing the metal nanowires in pure water is preferably 0.5 mPa·s to 100 mPa·s, more preferably 1 mPa·s to 50 mPa·s at 20° C.

The amount of the nanowire structure contained in the positive-type photosensitive composition is preferably 10 parts by mass to 500 parts by mass, more preferably 20 parts by mass to 300 parts by mass, on the basis of 100 parts by mass of the alkali-soluble polymer.

When the amount of the nanowire structure is less than 10 parts by mass, the coating amount required for obtaining conductivity becomes large, potentially increasing load in drying and developing steps. Whereas when the amount thereof is more than 500 parts by mass, the developability, especially the resolution may be degraded.

In addition to the alkali-soluble polymer, 1,2-quinonediazide compound and nanowire structure, if necessary, the positive-type photosensitive composition of the present invention may contain various additives such as a surfactant, an antioxidant, a sulfurization inhibitor, a metal corrosion inhibitor, a viscosity adjuster and an antiseptic agent.

The metal corrosion inhibitor is not particularly limited and may be appropriately selected depending on the purpose. Preferred examples thereof include thiols and azoles.

Examples of the azoles include benzotriazole, tolyltriazole, mercaptobenzothiazole, mercaptobenzotriazole, mercaptobenzotetrazole, (2-benzothiazolylthio)acetic acid and 3-(2-benzothiazolylthio)propionic acid.

Examples of the thiols include alkanethiols and fluorinated alkanethiols. Specific examples thereof include dodecanethiol, tetradecanethiol, hexadecanethiol, octadecanethiol, fluorodecanethiol; and alkali metal salts thereof; ammonium salts thereof; and amine salts thereof. And, at least one of them can be used. The metal corrosion inhibitor can impart more excellent corrosion inhibitory effect to the composition. The metal corrosion inhibitor may be dissolved in an appropriate solvent and added to a solution prepared by dissolving the positive-type photosensitive composition in a solvent, or may be added to the solution in the form of powder. Alternatively, the below-described patterned transparent conductive film formed from the positive-type photosensitive composition may be immersed in a metal corrosion inhibitor-containing bath for imparting corrosion inhibitory effect to it.

—Solvent—

As the solvent, preferred are those capable of dissolving the alkali-soluble polymer and the 1,2-quinonediazide compound. Also, the solvent is preferably at least one compound having a boiling point of 100° C. to 200° C., or a solvent mixture containing the compound in an amount of 20% by mass or more. The solvent mixture preferably has a boiling point of 100° C. to 200° C.

Examples of the solvent include water, butyl acetate, butyl propionate, ethyl lactate, methyl oxyacetate, ethyl oxyacetate, butyl oxyacetate, methyl methoxyacetate, ethy methoxyacetatel, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanate, ethyl 2-oxobutanate, dioxane, ethylene glycol, diethylene glycol, triethylene glycol, propylene glycol, dipropylene glycol, tripropylene glycol, 1,4-butandiol, ethylene glycol monoisopropyl ether, ethylene glycol monobutyl ether, propylene glycol monomethyl ether, propylene glycol monomethyl ether acetate, propylene glycol monoethyl ether acetate, propylene glycol monopropyl ether acetate, ethylene glycol monobutyl ether acetate, cyclohexanone, cyclopentanone, diethylene glycol monomethyl ether, diethylene glycol monomethyl ether acetate, diethylene glycol monoethyl ether, diethylene glycol monoethyl ether acetate, diethylene glycol monobutyl ether, diethylene glycol monobutyl ether acetate, diethylene glycol dimethyl ether, diethylene glycol diethyl ether, diethylene glycolmethylethyl ether, toluene, xylene, γ-butyrolactone and N,N-dimethylacetamide. These may be used individually or in combination.

Among these solvents, more preferred is use of at least one selected from propylene glycol monomethyl ether, propylene glycol monomethyl ether acetate, propylene glycol monoethyl ether acetate, methyl 3-methoxypropionate, ethyl 3-ethoxypropionate, diethylene glycol monoethyl ether acetate, diethylene glycol monobutyl ether acetate, diethylene glycol dimethyl ether, diethylene glycol methylethyl ether, ethyl lactate and butyl acetate, since the coated film becomes highly uniform. More preferred is use of at least one of propylene glycol monomethyl ether acetate, methyl 3-methoxypropionate, ethyl 3-ethoxypropionate, diethylene glycol methyl ethyl ether, ethyl lactate and butyl acetate, since the coated film of the formed positive-type photosensitive composition becomes highly uniform and highly safety to the human body.

In the positive-type photosensitive composition of the present invention, the amount of the solvent is preferably 5 parts by mass to 50 parts by mass on a solid basis per 100 parts by mass of the alkali-soluble polymer.

Various additives may be added to the positive-type photosensitive composition of the present invention, in order to improve its resolution, coating uniformity, developability and adhesion property. Examples of the additives include polymer dispersing agents such as acrylic polymers, styrene polymers, polyethylene imines and urethane polymers; surfactants such as anionic surfactants, cationic surfactants, nonionic surfactants and fluorine-containing surfactants; silicone resin-based coatability improvers; adhesion improvers such as silane coupling agents; UV absorbers such as alkoxybenzophenones, aggregation inhibitors such as sodium polyacrylate; thermal crosslinking agents such as epoxy compounds, melamine compounds and bisazide compounds; and alkali-dissolvability promoters such as organic carboxylic acids.

The additives may be commercially available products. Examples of the commercially available products include EFKA-745, EFKA-46, EFKA-47, EFKA-47EA, EFKA Polymer 100, EFKA Polymer 400, EFKA Polymer 401 and EFKA Polymer 450 (trade names) (these products are of Morishita Sangyo K.K.), SOLSPARS 3000, 5000, 9000, 12000, 13240, 13940, 17000, 20000, 24000, 24000GR, 26000, 28000 and 32000 (trade names) (these products are of Lubrizol Corporation), DISPERSE AID 6, DISPERSE AID 8, DISPERSE AID 15 and DISPERSE AID 9100 (trade names) (these products are of SAN NOPCO LIMITED), POLYFLOW No. 45, POLYFLOW KL-245, POLYFLOW No. 75, POLYFLOW No. 90 and POLYFLOW No. 95 (trade names) (these products are of KYOEISHA CHEMICAL Co., Ltd.), Disperbyk 161, Disperbyk 162, Disperbyk 163, Disperbyk 164, Disperbyk 166, Disperbyk 170, Disperbyk 180, Disperbyk 181, Disperbyk 182, BYK 300, BYK 306, BYK 310, BYK 320, BYK 330, BYK 344 and BYK 346 (trade names) (these products are of BYK Japan), Surfron SC-101 and Surfron KH-40 (trade names) (these products are of SEIMI CHEMICAL CO., LTD.), FUTARGENT 222F, FUTARGENT 251 and FTX-218 (trade names) (these products are of NEOS COMPANY LIMITED), EFTOP EF-351, EFTOP EF-352, EFTOP EF-601, EFTOP EF-801 and EFTOP EF-802 (trade names) (these products are of Mitsubishi Material Corporation), MEGAFACK F-171, MEGAFACK F-177, MEGAFACK F-475, MEGAFACK R-08 and MEGAFACK R-30 (trade names) (these products are of DIC Corporation), fluoroalkylbenzenesulfonic acid salts, fluoroalkylcarboxylic acid salts, fluoroalkylpolyoxyethylene ether, fluoroalkylammonium iodide, fluoroalkylbetaine, fluoroalkylsulfonic acid salts, diglycerine tetrakis(fluoroalkylpolyoxyethylene ether), fluoroalkyltrimethylammonium salts, fluoroalkylaminosulfonic acid salts, polyoxyethylene nonylphenyl ether, polyoxyethylene octylphenyl ether, polyoxyethylene alkyl ether, polyoxyethylene lauryl ether, polyoxyethylene oleyl ether, polyoxyethylene tridecyl ether, polyoxyethylene cetyl ether, polyoxyethylene stearyl ether, polyoxyethylene laurate, polyoxyethylene oleate, polyoxyethylene stearate, polyoxyethylene laurylamine, sorbitan laurate, sorbitan palmitate, sorbitan stearate, sorbitan oleate, sorbitan fatty acid esters, polyoxyethylene sorbitan laurate, polyoxyethylene sorbitan palmitate, polyoxyethylene sorbitan stearate, polyoxyethylene sorbitan eleate, polyoxyethylene naphthyl ether, alkylbenzene sulfonic acid salts and alkyldiphenyl ether disulfonic acid salts. These may be used individually or in combination.

Among these additives, particularly preferred is use of at least one selected from fluorine-containing surfactants such as fluoroalkylbenzenesulfonic acid salts, fluoroalkylcarboxylic acid salts, fluoroalkylpolyoxyethylene ethers, fluoroalkylammonium iodide, fluoroalkylbetaine, fluoroalkylsulfonic acid salts, diglycerine tetrakis(fluoroalkylpolyoxyethylene ether), fluoroalkyltrimethylammonium salts and fluoroalkylaminosulfonic acid salts; and silicone resins such as BYK 306, BYK 344 and BYK 346, since the formed positive-type photosensitive composition has high coating uniformity.

—Other Polymers—

In addition to the alkali-soluble polymer, other polymers may be added to the positive-type photosensitive composition of the present invention, in order to improve its heat resistance, chemical resistance, etc. As the other polymers, preferred are epoxy-containing polymers containing no carboxyl group and oxetanyl-containing polymers containing no carboxyl group. Examples of the epoxy- or oxetanyl-containing polymers containing no carboxyl group include homopolymers of glycidyl methacrylate, copolymers of glycidyl methacrylate and another radical polymerizable monofunctional monomer, homopolymers of 3-ethyl-3-methacryloxymethyloxetane, and copolymers of 3-ethyl-3-methacryloxymethyloxetane and another radical polymerizable monofunctional monomer. When these polymers are added to the positive-type photosensitive composition of the present invention, the formed composition is preferably improved in, for example, heat resistance, chemical resistance and developability. Among them, when homopolymers of glycidyl methacrylate, copolymers of glycidyl methacrylate and methyl methacrylate, homopolymers of 3-ethyl-3-methacryloxymethyloxetane, copolymers of glycidyl methacrylate and N-phenylmaleimide, and copolymers of glycidyl methacrylate 3-ethyl-3-methacryloxymethyloxetane are added to the positive-type photosensitive composition of the present invention, the formed composition is considerably improved in heat resistance, chemical resistance and developability, which is preferred.

Also, to such an extent that the formed composition is not degraded in heat resistance and chemical resistance, a small amount of an epoxy- or oxetanyl-containing polymer having a carboxyl group may be blended therewith for use. Examples of such a polymer include glycidyl methacrylate-monomethacryloxyethylhexa hydrophthalate copolymers, glycidyl methacrylate-methacrylic acid copolymers, and methacrylic acid homopolymers described in JP-A No. 04-198937. The polymer is not particularly limited thereto, so long as it contains such functional groups.

Examples of carboxyl group-containing radical polymerizable monomers serving as a raw material for these polymers include (meth)acrylic acid, crotonic acid, α-chloroacrylic acid, cinnamic acid, maleic acid, fumaric acid, itaconic acid, citraconic acid, mesaconic acid, ω-carboxypolycaprolactone mono(meth)acrylate, mono[2-(meth)acryloxyethyl]succinate, mono[2-(meth)acryloxyethyl]maleate and mono[2-(meth)acryloxyethyl]cyclohexene-3,4-dicarboxylate. Further, examples of epoxy-containing radical polymerizable monomers serving as a raw material for these polymers include glycidyl(meth)acrylate, methylglycidyl(meth)acrylate, α-ethyl acrylic acid glycidyl ester and 3,4-epoxycyclohexyl(meth)acrylate. These carboxy- or epoxy-containing radical polymerizable monomers may be used individually or in combination.

—Polyhydric Carboxylic Acid—

The positive-type photosensitive composition of the present invention may contain a polyhydric carboxylic acid such as trimellitic anhydride, phthalic anhydride or 4-methylcyclohexane-1,2-dicarboxylic anhydride. Among these polyhydric carboxylic acids, trimellitic anhydride is preferred.

By heating the positive-type photosensitive composition of the present invention containing the polyhydric carboxylic acid, the carboxyl group of the polyhydric carboxylic acid reacts with the oxetanyl and epoxy in the positive-type photosensitive composition, improving its heat resistance and chemical resistance. In addition, in the positive-type photosensitive composition of the present invention containing the polyhydric carboxylic acid, the 1,2-quinonediazide compound is prevented from decomposition during storage, preventing coloring of the positive-type photosensitive composition.

When the polyhydric carboxylic acid is added to the positive-type photosensitive composition of the present invention, the polyhydric carboxylic acid is 1 part by mass to 30 parts by mass, more preferably 2 parts by mass to 20 parts by mass, per 100 parts by mass of the alkali-soluble polymer.

When the positive-type photosensitive composition of the present invention is stored in the dark at a temperature of −30° C. to 25° C., the composition becomes stable over time, which is preferred. When the storage temperature is −20° C. to 10° C., no precipitates are formed, which is more preferred.

<Developer>

A developer for developing the positive-type photosensitive composition of the present invention after exposure is preferably an alkaline solution. Examples of the alkaline compound contained in the alkaline solution include tetramethylammonium hydroxide, tetraethylammonium hydroxide, 2-hydroxyethyltrimethylammonium hydroxide, sodium carbonate, sodium hydrogen carbonate, potassium carbonate, potassium hydrogen carbonate, sodium hydroxide and potassium hydroxide. As the developer, an aqueous alkaline solution is preferably used.

Further, specific examples of the developer include organic alkaline compounds such as tetramethylammonium hydroxide, tetraethylammonium hydroxide and 2-hydroxyethyltrimethylammonium hydroxide; and aqueous solutions of inorganic alkaline compounds such as sodium carbonate, potassium hydroxide and potassium hydroxide.

In order to reduce the amount of the residue after development and to form an appropriate patterned shape, a surfactant such as methanol or ethanol may be added to the developer. The surfactant may be an anionic surfactant, a cationic surfactant or a nonionic surfactant. Among them, polyoxyethylene alkyl ether (nonionic surfactant) is particularly preferably added to the developer, since the resolution is increased.

The developing method is not particularly limited and may be appropriately selected depending on the purpose. Examples thereof include dip development, paddle development and shower development.

(Transparent Conductive Film)

A transparent conductive film of the present invention is relatively high in resolution during patterning, and suitably used for forming a patterned conductive film. Here, the conductive film refers, for example, to a film (interlayer conductive film) provided for attaining electrical conduction between elements arranged in the form of laminate as well as in the same layer.

The transparent conductive film is formed as follows.

Specifically, the positive-type photosensitive composition of the present invention is applied onto a substrate (e.g., a glass substrate) through known methods such as spin coating, roll coating and slit coating. Alternatively, nanowire structures may be applied in advance and then a positive-type photosensitive composition containing no nanowire structures may be applied thereon, followed by drying, to thereby prepare the positive-type photosensitive composition of the present invention. But, preferred is a positive-type photosensitive composition formed by applying once a dispersion of nanowire structures in a resin coating liquid.

The substrate is not particularly limited and may be appropriately selected depending on the purpose. Examples thereof include transparent glass substrates such as white plate glasses, blue plate glasses and silica-coated blue glasses; synthetic resin sheets, films and substrates made of, for example, polycarbonates, polyethersulfones, polyesters, acrylic resins, vinyl chloride resins, aromatic polyamide resins, polyamideimides and polyimides; metal substrates such as aluminum plates, copper plates, nickel plates and stainless steel plates; and semiconductor substrates having other ceramic plates and photoelectric conversion elements. These substrates may be pre-treated, as desired, through a chemical treatment using a silane coupling agent, a plasma treatment, ion plating, sputtering, a vapor phase reaction method, vacuum vapor deposition, etc.

Next, the substrate is dried with a hot plate or an oven, generally at 60° C. to 120° C. for 1 min to 5 min. The dried substrate is irradiated patternwise with UV rays through a mask having a desired pattern. Preferably, i beams are applied at 5 mJ/cm$^2$ to 1,000 mJ/cm$^2$. As a result of UV irradiation, the 1,2-quinonediazide compound present in UV-irradiated portions is changed to indene carboxylic acid and rapidly dissolves in a developer.

After development by a commonly used developing method (e.g., shower development, spray development, paddle development or dip development), the substrate is thoroughly rinsed with pure water. The entirety of the substrate is irradiated again with UV rays at 100 mJ/cm$^2$ to 1,000 mJ/cm$^2$, followed by firing at 180° C. to 250° C. for 10 min to 120 min, whereby a desirably patterned transparent film can be obtained.

The thus-obtained patterned transparent conductive film can also be used as a patterned conductive film. The shape of holes formed in the conductive film is preferably square, rectangular, circular or ellipsoidal when the holes are viewed from directly above. Further, a film for orientation treatment may be formed on the patterned conductive film. The conductive film has high solvent resistance and heat resistance. Thus, even when the film for orientation treatment is formed, the conductive film involves no wrinkles, maintaining high transparency.

(Display Element)

A display element of the present invention is not particularly limited and may be appropriately selected depending on the purpose. Preferably, the display element is a liquid crystal display element.

The liquid crystal display element is formed from an element substrate having the patterned transparent conductive film in the above-described manner and a color filter substrate (counter substrate). Specifically, these substrates are positioned/pressure-bonded to each other and assembled through thermal treatment, and then liquid crystals are injected thereinto and finally, the inlet port is sealed. Preferably, a transparent conductive film formed on the color filter is also formed of the positive-type photosensitive composition of the present invention.

In an employable, alternative method for producing the liquid crystal display element, after liquid crystals have been spread on the element substrate, a substrate is superposed on the element substrate and the resultant product is sealed so that liquid crystals are not leaked.

In this manner, a highly transparent conductive film formed of the positive-type photosensitive composition of the present invention can be used in a liquid crystal display element.

Notably, liquid crystals (i.e., liquid crystal compounds and liquid crystal compositions) used in the liquid crystal display element are not particularly limited, and any liquid crystal compounds and liquid crystal compositions can be used.

(Integrated Solar Battery)

An integrated solar battery of the present invention (hereinafter may be referred to as a "solar battery device") is not particularly limited and may be the ones commonly used as a solar battery device.

Examples of the integrated solar battery include a single crystal silicon solar battery device, polycrystalline silicon solar battery device, an amorphous silicon solar battery device of a single junction or tandem structure, a III-V group compound semiconductor solar battery device using, for example, gallium arsenide (GaAs) and indium phosphide (InP), a II-VI group compound semiconductor solar battery device using, for example, cadmium tellurium (CdTe), a I-III-VI group compound semiconductor solar battery device of copper/indium/selenium type (so-called, CIS type), copper/indium/gallium/selenium type (so-called, CIGS type), or copper/indium/gallium/selenium/sulfur type (so-called, CIGSS type), a dye-sensitized solar battery device, and an organic solar battery device. Among them, the amorphous silicon solar battery device of a tandem structure, and the I-III-VI group compound semiconductor solar battery device of copper/indium/selenium type (so-called, CIS type), copper/indium/gallium/selenium type (so-called, CIGS type), or copper/indium/gallium/selenium/sulfur type (so-called, CIGSS type) are particularly preferable.

In the case of the amorphous silicon solar battery device of, for example, a tandem structure, amorphous silicon, a microcrystal silicon thin layer, a thin layer formed by adding Ge to the amorphous silicon or the microcrystal silicon thin layer, or a tandem structure of two or more layers selected therefrom is used as a photoelectric conversion layer. For the formation of the layer, a plasma chemical vapor deposition (PCVD) or the like is used.

[Production Method of Transparent Conductive Layer]

The transparent conductive layer for use in the integrated solar battery of the present invention is suitably applied for all of the solar battery devices listed above. The transparent conductive layer may be contained in any part of the solar battery device, but is preferably contained so as to be adjacent to the photoelectric conversion layer. With regard to the positioning of the transparent conductive layer and the photoelectric conversion layer, the structures listed below are preferable, but not limited thereto. Moreover, the structures below do not describe all of the parts constituting the solar battery device, and they only describe within the range where the positioning of the transparent conductive layer can be illustrated.

(A) substrate-transparent conductive layer (a product from the present invention)-photoelectric conversion layer
(B) substrate-transparent conductive layer (a product from the present invention)-photoelectric conversion layer-transparent conductive layer (a product from the present invention)
(C) substrate-electrode-photoelectric conversion layer-transparent conductive layer (a product from the present invention)
(D) back side electrode-photoelectric conversion layer-transparent conductive layer (a product from the present invention)

The method for forming the transparent conductive layer includes applying onto a substrate a coating liquid in which the nanowire structure has been dispersed and drying the coating liquid.

After application of the coating liquid, annealing may be carried out by heating. At the time of the annealing, the heating temperature is preferably 50° C. to 300° C., more preferably 70° C. to 200° C.

The method for applying the coating liquid is suitably selected depending on the intended purpose without any restriction. Examples thereof include web coating, spray coating, spin coating, doctor blade coating, screen printing, gravure printing and inkjet printing. Especially with the web coating, screen printing and inkjet printing, roll-to-roll production on a flexible substrate can be performed.

Non-limitative examples of the substrate are listed below.
(1) glass such as quartz glass, alkali-free glass, crystallized transparent glass, Pyrex (registered trademark) glass, sapphire
(2) thermoplastic resin such as acrylic resin (e.g. polycarbonate and polymethacrylate), polyvinyl chloride resin (e.g. polyvinyl chloride and vinyl chloride copolymer); polyacrylate; polysulfone; polyether sulfone; polyimide; PET; PEN; fluororesin; phenoxy resin; polyolefine resin; nylon; styrene resin; and ABS resin
(3) thermosetting resin such as epoxy resin A surface of the substrate may be subjected to a treatment to give hydrophilicity thereto. Preferably, the substrate surface is coated with a hydrophilic polymer. By these treatments, coating performance and adhesion of the aqueous dispersion to the substrate are improved.

The treatment for hydrophilicity is suitably selected depending on the intended purpose without any restriction. Examples thereof include a chemical treatment, physical roughening, corona discharge, flame treatment, ultraviolet ray treatment, glow discharge, active plasma treatment and laser treatment. It is preferred that the surface tension of the surface of the substrate become 30 dyne/cm or more as a result of the surface treatment.

The hydrophilic polymer applied onto the substrate surface is suitably selected depending on the intended purpose without any restriction. Examples thereof include gelatin, gelatin derivatives, casein, agar, starch, polyvinyl alcohol, polyacrylic acid copolymer, carboxymethyl cellulose, hydroxyethyl cellulose, polyvinyl pyrrolidine and dextran.

The thickness of the hydrophilic polymer layer (in a dried state) is preferably 0.001 µm to 100 µm, more preferably 0.01 µm to 20 µm.

A hardening agent is preferably added to the hydrophilic polymer layer so as to increase the film strength. The hardening agent is suitably selected depending on the intended purpose without any restriction. Examples of thereof include: aldehyde compounds such as formaldehyde and glutaraldehyde; ketone compounds such as diacetyl and cyclopentanedione; vinyl sulfone compounds such as divinyl sulfone; triazine compounds such as 2-hydroxy-4,6-dichloro-1,3,5-triazine; and isocyanate compounds described in U.S. Pat. No. 3,103,437.

The hydrophilic polymer layer is formed by the following manner. Specifically, a coating liquid is prepared by dissolving and/or dispersing the aforementioned compound in a solvent such as water; and the obtained coating liquid is applied to a surface of the substrate, which has been treated to give hydrophilicity thereto by a coating method such as spin coating, dip coating, extrusion coating, bar coating and die coating, followed by drying. The drying temperature is preferably 120° C. or less, more preferably 30° C. to 100° C., yet more preferably 40° C. to 80° C.

Moreover, an undercoat layer may be formed between the substrate and the hydrophilic polymer layer for improving the adhesion therebetween.

—CIGS Solar Battery—

Hereinafter, a CIGS solar battery is described in detail.

—Structure of Photoelectric Conversion Layer—

A thin film solar battery using $CuInSe_2$ (CIS thin film), which is a semiconductor thin film of a chalcopyrite structure consisting of a Ib group element, a IIIb group element and a VIb group element, or $Cu(In,Ga)Se_2$ (CIGS thin film), in which Ga is solid soluted to CuInSe$_2$, for a light absorption layer has high energy conversion efficiency, and, advantageously, the efficiency thereof is deteriorated due to light radiation in only a small degree. FIGS. 2A to 2D are cross sectional diagrams of the device for explaining the conventional production method of the cell of a CIGS thin film solar battery.

Figure 2A:
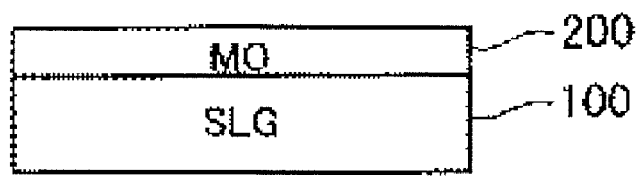
FIG. 2A illustrates a step of an exemplary method for producing a cell of a CIGS thin film solar battery.
Figure 2B:
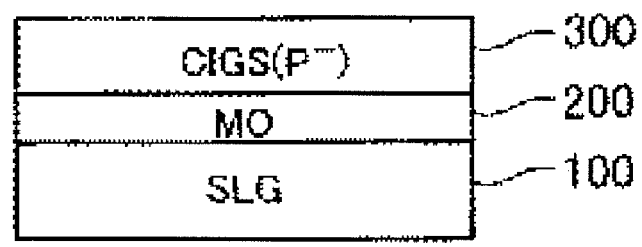
FIG. 2B illustrates a step of an exemplary method for producing a cell of a CIGS thin film solar battery.
Figure 2C:
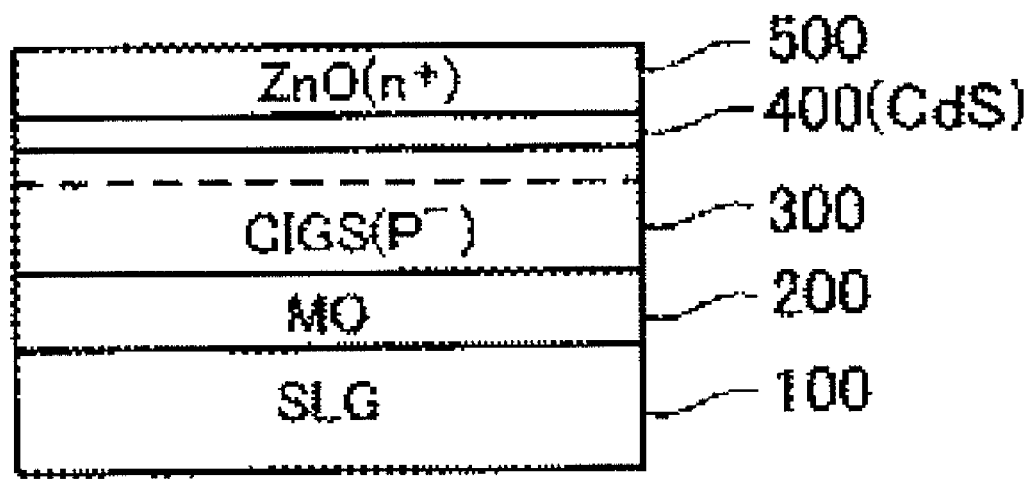
FIG. 2C illustrates a step of an exemplary method for producing a cell of a CIGS thin film solar battery.
Figure 2D:
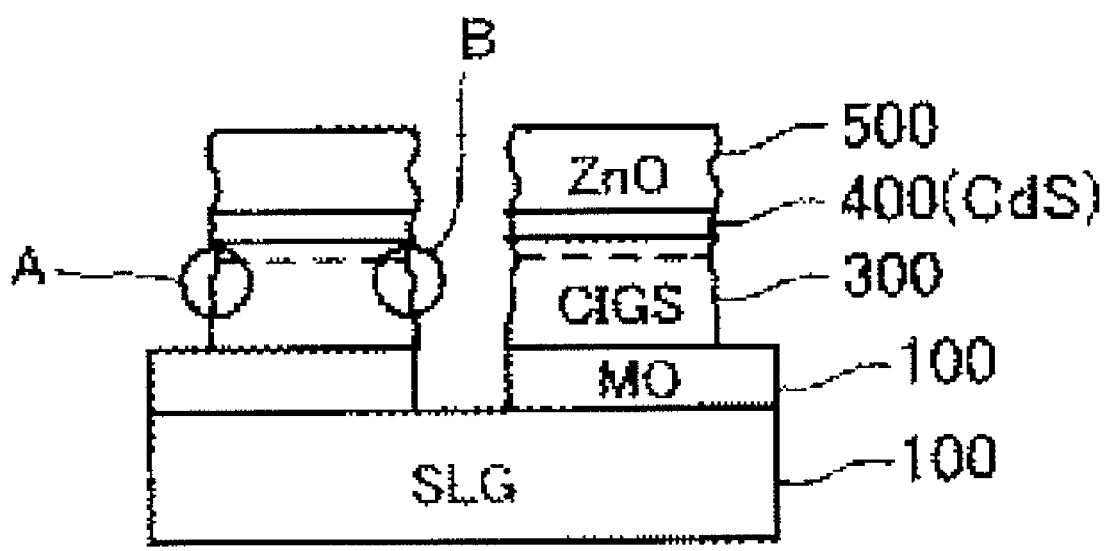
FIG. 2D illustrates a step of an exemplary method for producing a cell of a CIGS thin film solar battery.

As shown in FIG. 2A, first, a molybdenum (Mo) electrode layer 200, which will be a lower electrode with respect to the plus side, is formed on a substrate 100. Then, as shown in FIG. 2B, a light absorption layer 300 formed of CIGS thin film exhibiting p⁻ type property as a result of the adjustment of the composition is formed on the Mo electrode layer 200. Subsequently, as shown in FIG. 2C, a buffer layer 400 of CdS or the like is formed on the light absorption layer 300, and a transparent electrode 500, which exhibits n⁺ type property by the doping of impurities, serves as an upper electrode at the minus side and is formed of zinc oxide (ZnO), is formed on the buffer layer 400. Here, the transparent conductive film of the present invention is laminated on ZnO or used instead of ZnO, to thereby obtain the solar battery device of the present invention. As shown in FIG. 2D, scribing processing is carried out at the same time from the transparent electrode layer 500 of ZnO to the Mo electrode layer 200 by means of a mechanical scribe device. By this processing, each cell of the thin film solar battery is electrically separated (i.e., each cell is individualized). The compounds with which a film can be suitably formed in this embodiment are listed below.

(1) Compounds containing an element, a compound or an alloy that becomes a liquid phase at ambient temperature or by heating (2) Chalcogen compound (compound containing S, Se and Te)

II-VI group compound: ZnS, ZnSe, ZnTe, CdS, CdSe, CdTe, etc.

I-III-VI$_2$ group compound: CuInSe$_2$, CuGaSe$_2$, Cu(In,Ga)Se$_2$, CuInS$_2$, CuGaSe$_2$, Cu(In,Ga)(S,Se)$_2$, etc.

I-III$_3$-VI$_5$ group compound: CuIn$_3$Se$_5$, CuGa$_3$Se$_5$, Cu(In,Ga)$_3$Se$_5$, etc.

(3) Compound of chalcopyrite structure and Compound of defect stannite structure I-III-VI$_2$ group compound: CuInSe$_2$, CuGaSe$_2$, Cu(In,Ga)Se$_2$, CuInS$_2$, CuGaSe$_2$, Cu(In,Ga)(S,Se)$_2$, etc.

I-III$_3$-VI$_5$ group compound: CuIn3$_3$e$_5$, CuGa$_3$Se$_5$, Cu(In,Ga)$_3$Se$_5$, etc.

Note that, in the above, (In,Ga) and (S,Se) respectively represent (In$_{1-x}$Ga$_x$) and (S$_{1-y}$Se$_y$), where x=0 to 1 and y=0 to 1.

Hereinafter, typical examples of the formation method of CIGS layer are described, but the formation method thereof is not limited to these examples.

1) Multiple Source Simultaneous Deposition

The typical methods of the multiple source simultaneous deposition are a three-stage deposition method developed by NREL (National Renewable Energy Laboratory), USA, and a simultaneous deposition method developed by EC Group. The three-stage deposition is described, for example, in J. R. Tuttle, J. S. Ward, A. Duda, T. A. Berens, M. A. Contreras, K. R. Ramanathan, A. L. Tennant, J. Keane, E. D. Cole, K. Emery and R. Noufi: Mat. Res. Soc. Symp. Proc., Vol. 426 (1996) p. 143. Moreover, the simultaneous deposition method is described, for example, in L. Stolt et al.: Proc. 13th ECPVSEC (1995, Nice) 1451.

The three-stage deposition is a method in which In, Ga and Se are simultaneously deposited at the substrate temperature of 300° C. in high vacuum, then the temperature is elevated to 500° C. to 560° C. to thereby simultaneously deposit Cu and Se, and thereafter In, Ga, and Se are simultaneously deposited again to thereby obtain a graded band gap CIGS film a forbidden band width of which is inclined. The method of EC Group is a method which improves a bilayer deposition method developed by Boeing, in which Cu excess CIGS is deposited at the initial state and In excess CIGS is deposited in a later stage, so as to be able to be applied to the inline process. The bilayer deposition method is described in W. E. Devaney, W. S. Chen, J. M. Stewart, and R. A. Mickelsen: IEEE Trans. Electron. Devices 37 (1990) 428.

Both of the three-stage deposition method and the simultaneous deposition method of EC Group form Cu excess CIGS film composition in the process of growing the film and utilize a liquid phase sintering of the liquid phase Cu$_{2-x}$Se (x=0 to 1) which is obtained from the phase separation from the Cu excess CIGS. Therefore, advantageously, large grains grow and the CIGS film having excellent crystallinity can be obtained in these methods.

Furthermore, various methods have recently been studied to modify the method mentioned above for improving the crystallinity of the CIGS film, and these methods can also be used.

(a) Method Using Ionized Ga

This is a method to ionize Ga by passing evaporated Ga through a grid on which thermions generated by a filament are present so that the evaporated Ga collides against the thermions. The ionized Ga is accelerated by extraction voltage and then supplied to the substrate. The details thereof are described in H. Miyazaki, T. Miyake, Y. Chiba, A. Yamada, M. Konagai, phys. stat. sol. (a), Vol. 203 (2006) p. 2603.

(b) Method Using Cracked Se

The evaporated Se generally forms clusters, but it is a method to make Se clusters lower molecules by thermally decomposing the Se clusters by means of a high temperature heater (Proceedings of the 68th Meeting of The Japan Society of Applied Physics (Hokkaido Institute of Technology, autumn, 2007) 7P-L-6).

(c) Method Using Radicalized Se

This is a method using Se radicals generated by a bulb tracking device (Proceedings of the 54$^{th}$ Meeting of The Japan Society of Applied Physics (Aoyama Gakuin University, spring, 2007) 29P-ZW-10).

(d) Method Using a Photoexcitation Process

This is a method in which KrF excimer laser light (e.g., wavelength of 248 nm, 100 Hz) or YAG laser light (e.g., wavelength of 266 nm, 10 Hz) is applied to a surface of a substrate during three-stage deposition (Proceedings of the 54$^{th}$ Meeting of The Japan Society of Applied Physics (Aoyama Gakuin University, spring, 2007) 29P-ZW-14).

2) Selenidation Method

The selenidation method is also called a two-step deposition method. In this method, a metal precursor of a laminate film such as Cu layer/In layer or (Cu—Ga) layer/In layer is formed by sputtering, deposition, electrodeposition, or the like, then the formed film is heated up to about 450° C. to about 550° C. in selenium vapor or hydrogen selenide to thereby produce a selenium compound such as Cu(In$_{1-x}$Ga$_x$)Se$_2$ as a result of a thermal diffusion reaction. This method is called a vapor phase selenidation method, but other than this, there is a solid phase selenidation method in which a solid phase of selenium is deposited on a metal precursor film, and the solid phase of the selenium is selenided by a solid diffusion reaction using the solid phase of selenium as a selenium source. The only method which has currently been succeeded in mass production of a large area is a selenidation method in which a metal precursor film is formed by sputtering, which is suitable for production of large area, and the metal precursor is selenided in hydrogen selenide.

According to this method, however, the film expands about twice in its volume at the time of selenidation, and thus the internal strain is generated, and voids of about a few micrometers are formed in the formed film. These internal strain and voids adversely affect the adhesion to the substrate or properties of the solar battery and become factors to limit the photoelectric conversion efficiency (B. M. Basol, V. K. Kapur, C. R. Leidholm, R. Roe, A. Halani, and G. Norsworthy: NREL/SNL Photovoltaics Prog. Rev. Proc. 14th Conf.—A Joint Meeting (1996) AIP Conf. Proc. 394).

In order to avoid such rapid cubic expansion of the film at the time of the selenidation, a method in which selenium is previously added to the metal precursor film at a certain ratio (T. Nakada, R. Ohnishi, and A. Kunioka: "CuInSe$_2$-Based Solar Cells by Se-Vapor Selenization from Se-Containing Precursors" Solar Energy Materials and Solar Cells 35 (1994) pp. 204-214), and use of a multilayer precursor film in which selenium is placed between metal thin films (e.g., laminating Cu layer/In layer/Se layer . . . Cu layer/In layer/Se layer) (T. Nakada, K. Yuda, and A. Kunioka: "Thin Films of CuInSe$_2$ Produced by Thermal Annealing of Multilayers with Ultra-Thin stacked Elemental Layers" Proc. of 10th European Photovoltaic Solar Energy Conference (1991) pp. 887-890) have been proposed. By these, the aforementioned problem of the expansion of the deposition can be avoided in a certain degree.

However, there is a problem that is applied to all methods of selenidation, including the methods described above. That is a problem that there is an extremely low degree of freedom for controlling the film composition, when the metal laminate film whose composition is set is used from the beginning and this is then selenided. For example, a graded band gap CIGS thin film in which the Ga concentration is gradually changed in the thickness direction is currently used for the high efficiency CIGS solar battery. In order to form such thin film by the selenidation method, there is a method in which a Cu—Ga alloy film is deposited at first, and the Ga concentration is made gradually changed in the thickness direction using natural thermal diffusion at the time of the selenidation (K. Kushiya, I. Sugiyama, M. Tachiyuki, T. Kase, Y. Nagoya, O. Okumura, M. Sato, O. Yamase and H. Takeshita: Tech. Digest 9th Photovoltaic Science and Engineering Conf. Miyazaki, 1996 (Intn. PVSEC-9, Tokyo, 1996) p. 149).

3) Sputtering Method

As sputtering is suitable for a deposition of a large area, various methods have been proposed as a formation method of a CuInSe$_2$ thin film. Examples thereof include a method using CuInSe$_2$ polycrystal as a target, and a two-source sputtering method in which Cu$_2$Se and In$_2$Se$_3$ are used as a target, and mixed gas of H$_2$Se and Ar are used as sputtering gas (J. H. Ermer, R. B. Love, A. K. Khanna, S. C. Lewis and F. Cohen: "CdS/CuInSe$_2$ Junctions Fabricated by DC Magnetron Sputtering of Cu$_2$Se and In$_2$Se$_3$ "Proc. 18th IEEE Photovoltaic Specialists Conf. (1985) pp. 1655-1658). Moreover, there has been proposed a three-source sputtering method in which a Cu target, In target and Se or CuSe target is sputtered in Ar gas (T. Nakada, K. Migita, A. Kunioka:" Polycrystalline CuInSe$_2$ Thin Films for Solar Cells by Three-Source Magnetron Sputtering" Jpn. J. Appl. Phys. 32 (1993) L1169-L1172, and T. Nakada, M. Nishioka, and A. Kunioka: "CuInSe$_2$ Films for Solar Cells by Multi-Source Sputtering of Cu, In, and Se—Cu Binary Alloy" Proc. 4th Photovoltaic Science and Engineering Conf. (1989) 371-375).

4) Hybrid Sputtering Method

Suppose that the problem of the aforementioned sputtering method is damage on a surface of the film due to Se negative ions or high energy Se particles, this can be avoided by changing only Se to thermal vapor. Nakata et al. have formed a CIS thin film having a small number of defects by a hybrid sputtering method in which the metals of Cu and In are deposited by DC sputtering and only Se is deposited by vapor deposition, and have produced a CIS solar battery having a conversion efficiency of more than 10% (T. Nakada, K. Migita, S. Niki, and A. Kunioka: "Microstructural Characterization for Sputter-Deposited CuInSe$_2$ Films and Photovoltaic Devices" Jpn. Appl. Phys. 34 (1995) 4715-4721). Moreover, before Nakata et al., Rockett et al. reported a hybrid sputtering method for replacing toxic H$_2$Se gas with Se vapor (A. Rockett, T. C. Lommasson, L. C. Yang, H. Talieh, P. Campos and J. A. Thornton: Proc. 20th IEEE Photovoltaic Specialists Conf. (1988) 1505). Further back in the date, there was proposed a method in which sputtering was carried out in Se vapor so as to supplement insufficient Se in the film (S. Isomura, H. Kaneko, S. Tomioka, I. Nakatani, and K. Masumoto: Jpn. J. Appl. Phys. 19 (Suppl. 19-3) (1980) 23).

5) Mechanochemical Process

Raw materials for each composition of CIGS are placed into a container of a planetary ball mill, and then are mixed by physical energy to thereby obtain CIGS powder. Thereafter, it is applied onto a substrate by screen printing and subjected to annealing to thereby obtain a film of CIGS (T. Wada, Y. Matsuo, S. Nomura, Y. Nakamura, A. Miyamura, Y. Chia, A. Yamada, M. Konagai, Phys. stat. sol. (a), Vol. 203 (2006) p. 2593).

6) Other Methods

As other formation methods of a CIGS film, for example, screen printing, close space sublimation, MOCVD and spraying are used. In the screen printing, spraying and the like, a thin film consisting of fine particles formed of the components of a Ib group element, a IIIb group element, a VIb group element and compounds thereof is formed on a substrate, and crystals of desired compositions are obtained by thermal treatment or thermal treatment in atmosphere of the VIb group element. For example, after coating oxide particles to thereby form a thin film, the thin film is heated in hydrogen selenide atmosphere. A thin film of an organic metal compound containing a PVSEC-17 PL5-3, or a metal-VIb group element bond is formed on a substrate by spraying or printing, followed by thermal decomposition, to thereby obtain a desired inorganic thin film. In case of S, examples thereof include metal mercaptide, thiosalt of metal, dithiosalt of metal, thiocarbonate of metal, dithiocarbonate of metal, trithiocarbonate of metal, thiocarbamate of metal and dithiocarbamate of metal (JP-A Nos. 09-74065 and 09-74213).

—Value of Band Gap and Distribution Control—

Figure 3:
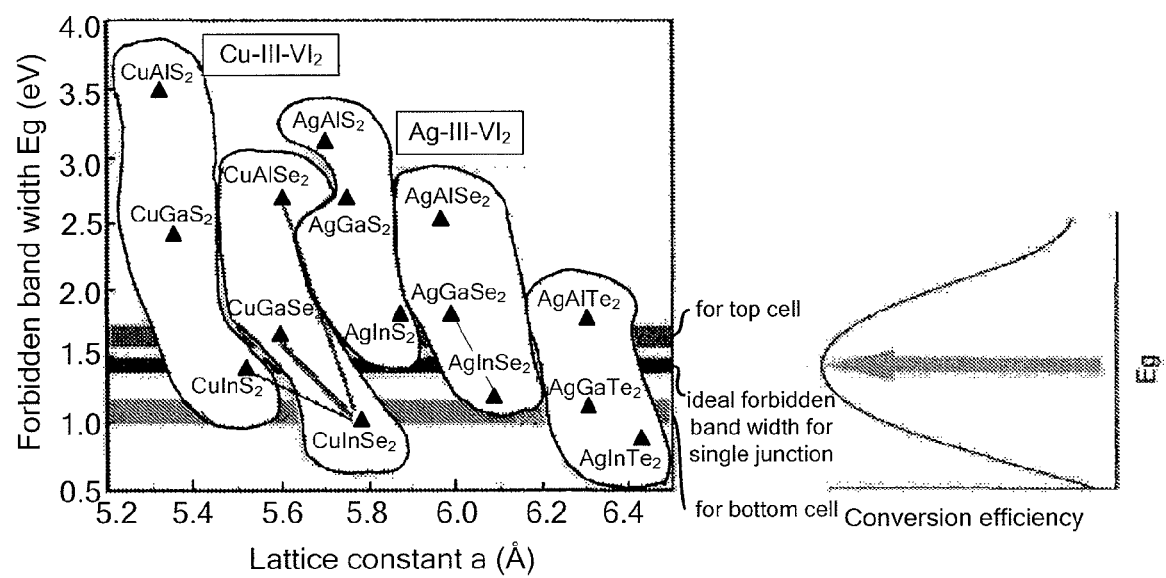
FIG. 3 is a diagram of the relationship between a lattice constant and band gap in the semiconductor formed of the Ib group element, IIIb group element, and VIb group element.

A semiconductor formed of various combinations of I group element-III group element-VI group element is preferably used for the light absorption layer of the solar battery. The one well known in the art is illustrated in FIG. 3. FIG. 3 is a diagram showing a relationship between a lattice constant and band gap of a semiconductor formed of Ib group element, IIIb group element and VIb group element. Various forbidden band widths (band gaps) can be obtained by changing the composition ratio. In the case where photons of large energy are injected to the semiconductor by the band gap, the energy larger than the band gap is lost as heat. It has been known by a theoretical calculation that the maximum conversion efficiency with the combination of the spectrum of sun light and the band gap is about 1.4 eV to about 1.5 eV. For the purpose of increasing the conversion efficiency of the CIGS solar battery, for example, by increasing the concentration of Ga of $Cu(In_xGa_{1-x})S_2$, the concentration of Al of $Cu(In_xAl_x)S_2$, or the concentration of S of CuInGa(S,Se), the band gap of high conversion efficiency is obtained. In case of $Cu(In_xGa_{1-x})S_2$, the maximum conversion efficiency can be adjusted in the range of 1 eV to 1.68 eV.

Note that, in FIG. 3, $Cu(In_{1-x}Ga_x)Se_2$(CIGS) is a mixed crystal of $CuInSe_2$ and $CuGaSe_2$. The forbidden band width can be controlled in the range of 1.04 eV to 1.68 eV by changing the Ga concentration x. Other mixed crystals are $Cu(InAl)Se_2$, $Ag(InGa)Se_2$, $CuIn(S,Se)_2$, $AgIn(S,Se)_2$.

Moreover, the band structure can be graded by changing the composition ratio in the thickness direction of the film. There are two types of band gaps, which are a single graded band gap in which the band gap is increased in the direction from the light incident side to the opposite electrode side, and a double graded band gap in which the band gap is reduced in the direction from the light incident side to the PN junction part, and the band gap is increased as passed through the PN junction part. Such solar battery is disclosed, for example, in T. Dullweber, A new approach to high-efficiency solar cells by band gap grading in $Cu(In,Ga)Se_2$ chalcopyrite semiconductors, Solar Energy Materials & Solar Cells, Vol. 67, pp. 145-150 (2001). In any of these cases, carriers excited by light are accelerated and thus become easier to arrive at the electrode as the electric field is internally generated due to the graded band structure, and a chance of combination with recombination center is reduced, to thereby improve generating efficiency (International Publication No. WO 2004/090995).

—Tandem Type—

By using a plurality of semiconductors each having different band gaps depending on the range of the spectrum, heat loss due to the deviation of photon energy and the band gap is reduced, and thus the generation efficiency can be increased. The one using a plurality of photoelectric conversion layers in lamination in the aforementioned manner is called a tandem type. In case of the two-layer tandem, the generation efficiency can be improved, for example, by using a combination of 1.1 eV and 1.7 eV.

—Structure Other than Photoelectric Conversion Layer—

For a n-type semiconductor which forms a junction with the I-III-VI group compound semiconductor, for example, II-VI group compounds such as CdS, ZnO, ZnS and Zn (O, S, OH) can be used. Use of these compounds are preferable as these compound can form a contact interface with the photoelectric conversion layer at which recombination of carriers are not occur (refer to JP-A No. 2002-343987).

[Substrate]

As the substrate, for example, those listed below can be used. They are a glass plate such as soda-lime glass; a film of polyimide, polyethylene naphthalate, polyether sulfone, polyethylene terephthalate or aramide; a metal plate of stainless steel, titanium, aluminum or copper; and a laminate mica substrate described in JP-A No. 2005-317728. Among them, as the substrate for the element for use in the present invention, those having the shape of a film or a foil are preferable.

[Backside Electrode]

For the backside electrode, for example, metals such as molybdenum, chrome, tungsten and the like can be used. These metal materials are preferable as they do not tend to mix with other layers even when subjected to a heat treatment. In the case where a photoelectromotive force layer containing a semiconductive layer (light absorption layer) formed of a I-III-VI group compound semiconductor is used, the molybdenum layer is preferably used. Moreover, the recombination center is present at the interface of the light absorption layer CIGS and the backside electrode. For this reason, if the contact area of the backside electrode and the light absorption layer is equal to and more than the area necessary for electric conduction, the generating efficiency is lowered. Therefore, in order to reduce the contact area, the electrode layer is, for example, formed to have a structure in which an insulating material and metal are placed in stripes (refer to JP-A No. 09-219530).

Examples of the layer structure of the backside electrode include a super straight structure and a substrate structure. In the case where a photoelectromotive force layer containing a semiconductive layer (light absorption layer) formed of a I-III-VI group compound semiconductor is used, it is more preferably to use the substrate structure, since the conversion efficiency thereof is high.

[Buffer Layer]

For the buffer layer, for example, CdS, ZnS, ZnS(O,OH), ZnMgO and the like can be used. If the band gap of the light absorption layer is widened, for example, by increasing the concentration of Ga in CIGS, the conduction band thereof becomes a lot bigger than that of ZnO. Therefore, ZnMgO, a conduction band of which has large energy, is preferable for the buffer layer.

[Transparent Conductive Layer]

After formation of the buffer layer, the transparent conductive layer for use in the solar battery of the present invention is formed preferably by coating a nanowire structure dispersion. Alternatively, a ZnO layer is formed after the formation of the buffer layer, and then the nanowire structure dispersion may be applied thereonto.

The formation method of the transparent conductive layer includes applying the dispersion onto the substrate, and drying. After application of the dispersion, annealing may be carried out by heating. Here, the heating temperature is preferably 50° C. to 300° C., more preferably 70° C. to 200° C.

The transparent conductive layer can be used for a transparent electrode of any solar battery. Moreover, the transparent conductive layer can be applied for a crystal (monocrystal, polycrystal, etc.) silicon solar battery, which does not use a transparent electrode, as an electrode for power collection. For the crystal silicon solar battery, a silver deposited electric wires, or electric wires formed of a silver paste is generally used as the powder collection electrode. However, by applying the transparent conductive layer for use in the present invention for the powder collection electrode, the crystal silicon solar battery also obtains high photoelectric conversion efficiency.

Moreover, as the solar battery of the present invention contains a transparent conductive layer having a high transmittance with respect to light of the infrared region and a low sheet resistance, it is suitably used for a solar battery having a large absorption with respect to light of the infrared region, such as an amorphous silicon solar battery of a tandem structure or the like, and a I-III-VI group compound semiconductor solar battery of Cu/In/Se (i.e., CIS type), Cu/In/Ga/Se (i.e., CIGS type), Cu/In/Ga/Se/S (i.e., CIGSS type), or the like.

EXAMPLES

The present invention will next be described by way of examples, which should not be construed as limiting the present invention thereto.

In the following examples, the diameter of a metal nanowire, the major axis length of a metal nanowire, the variation coefficient of diameters of metal nanowires, an appropriate wire yield, and a sharpness of angles of the cross section of a metal nanowire are respectively measured in the following manners.

<Diameter and Major Axis Length of Metal Nanowire>

Three hundred metal nanowires were observed under a transmission electron microscope (TEM) (JEM-2000FX, manufactured by JEOL Ltd.). Based on the average value obtained from the observation, the diameter and major axis length of the metal nanowires were obtained.

<Variation Coefficient of Diameters of Metal Nanowires>

Three hundred metal nanowires were observed under a transmission electron microscope (TEM) (JEM-2000FX, manufactured by JEOL Ltd.). Based on the average value obtained from the observation, the diameter of the metal nanowires was calculated. Then, the variation coefficient was obtained by calculating the standard deviation and the average value.

<Appropriate Wire Yield>

Each silver nanowire aqueous dispersion was filtered so as to separate silver nanowires from other particles, and the amount of Ag remained on the filter paper and the amount of Ag passed through the filter paper were respectively measured by means of ICP ATOMIC EMISSION SPECTROMETER (ICPS-8000, manufactured by Shimadzu Corporation), to thereby obtain the metal content (% by mass) of the metal nanowires (appropriate wires) each having a diameter of 50 nm or less and a length of 5 μm or more with respect to the total metal particles.

Note that, a membrane filter (FALP 02500, manufactured by Nihon Millipore K.K., pore size: 1.0 μm) was used for separating the appropriate wires when the appropriate wire yield was obtained.

<Sharpness of Angle of Cross Section of Metal Nanowire>

The cross sectional shape of the metal nanowire was observed by applying a metal nanowire aqueous dispersion onto a substrate and observing the cross section thereof by means of a transmission electron microscope (TEM) (JEM-2000FX, manufactured by JEOL Ltd.). The periphery of the cross section and total length of each side were respectively measured on the cross sections of the three hundred metal nanowires, and the sharpness was determined as a ratio of "the periphery of the cross section" to the total length of "each side of the cross section." When the sharpness was less than 75% or less, the angles of the cross sectional shape were considered to be round.

Synthesis Example 1

Synthesis of Alkali-Soluble Polymer (1)

KAYARAD TC-110S (monomer A) (product of NIPPON KAYAKU Co., Ltd), (3-ethyl-3-oxetanyl)methyl acrylate (monomer b1), glycidyl acrylate (monomer b2) and 2-hydroxylethyl acrylate (monomer b3) were charged in the following formulation into a four-necked flask equipped with a stirrer, followed by polymerization under heating for 4 hours at the reflux temperature of 2-butanone. The polymerization initiator used was 2,2'-azobis(2,4-dimethylvaleronitrile).
  2-Butanoen: 200.0 g
  TC-110S: 1.0 g
  (3-Ethyl-3-oxetanyl)methyl acrylate: 19.0 g
  Glycidyl acrylate: 30.0 g
  2-Hydroxylethyl acrylate: 50.0 g
  2,2'-Azobis(2,4-dimethylvaleronitrile): 2.0 g Next, the reaction mixture was cooled to room temperature, and a large amount of hexane was charged thereto. The precipitates that formed were dissolved in methyl 3-methoxypropionate (hereinafter abbreviated as "MMP"). Subsequently, hexane (polymerization solvent) was removed at 100° C. under the reduced pressure of $1.33 \times 10^4$ Pa, to thereby prepare a MMP solution of alkali-soluble polymer (1).

A part of the thus-prepared MMP solution was sampled and dried at 220° C. for 30 min, whereby the mass reduced was calculated. Considering the obtained value, MMP was added so that the concentration of the polymer was adjusted to 30% by mass. The resultant solution was subjected to measurement, and as a result, the yield of alkali-soluble polymer (1) was found to be 78%. Also, through GPC analysis, alkali-soluble polymer (1) was found to have a weight average molecular weight (converted to polyethylene oxide (standard)) of 5,800.

Synthesis Example 2

Synthesis of Alkali-Soluble Polymer (2)

The same components as in Synthesis Example 1, except that (3-ethyl-3-oxetanyl)methyl methacrylate, glycidyl methacrylate and 2-hydroxylethyl methacrylate were used respectively as monomer b1, monomer b2 and monomer b3, were charged in the following formulation, followed by polymerization.
  2-Butanone: 200.0 g
  TC-110S: 20.0 g
  (3-Ethyl-3-oxetanyl)methyl methacrylate: 15.0 g
  Glycidyl methacrylate: 30.0 g
  2-Hydroxylethyl methacrylate: 35.0 g
  2,2'-Azobis(2,4-dimethylvaleronitrile): 2.0 g Next, in the same manner as in Synthesis Example 1, a 30% by mass MMP of alkali-soluble polymer (2) was prepared. The yield of the polymer was found to be 75%. Also, through GPC analysis, alkali-soluble polymer (2) was found to have a weight average molecular weight (converted to polyethylene oxide (standard)) of 5,200.

Synthesis Example 3

Synthesis of Alkali-Soluble Polymer (3)

The same components as in Synthesis Example 1, except that (2-ethyl-2-oxetanyl)methyl acrylate, methylglycidyl methacrylate and 2-hydroxylpropyl acrylate were used respectively as monomer b1, monomer b2 and monomer b3, were charged in the following formulation, followed by polymerization.
  2-Butanone: 200.0 g
  TC-110S: 65.0 g
  (2-Ethyl-2-oxetanyl)methyl acrylate: 15.0 g
  Methylglycidyl methacrylate: 10.0 g
  2-Hydroxylpropyl acrylate: 10.0 g
  2,2'-Azobis(2,4-dimethylvaleronitrile): 2.0 g Next, in the same manner as in Synthesis Example 1, a 30% by mass MMP of alkali-soluble polymer (3) was prepared. The yield of the polymer was found to be 69%. Also, through GPC analysis, alkali-soluble polymer (3) was found to have a weight average molecular weight (converted to polyethylene oxide (standard)) of 5,000.

Synthesis Example 4

Synthesis of Alkali-Soluble Polymer (4)

The same components as in Synthesis Example 1, except that (2-ethyl-2-oxetanyl)methyl methacrylate, 3,4-epoxycyclohexyl methacrylate and 2-hydroxylpropyl methacrylate were used respectively as monomer b1, monomer b2 and monomer b3, were charged in the following formulation, followed by polymerization.
- 2-Butanone: 200.0 g
- TC-110S: 80.0 g
- (2-Ethyl-2-oxetanyl)methyl methacrylate: 5.0 g
- 3,4-Epoxycyclohexyl methacrylate: 10.0 g
- 2-Hydroxylpropyl methacrylate: 5.0 g
- 2,2'-Azobis(2,4-dimethylvaleronitrile): 2.0 g Next, in the same manner as in Synthesis Example 1, a 30% by mass MMP of alkali-soluble polymer (4) was prepared. The yield of the polymer was found to be 68%. Also, through GPC analysis, alkali-soluble polymer (4) was found to have a weight average molecular weight (converted to polyethylene oxide (standard)) of 5,100.

Synthesis Example 5

Synthesis of Alkali-Soluble Polymer (5)

The below-listed components including 2-butanone as a solvent were charged into the same apparatus as in Synthesis Example 1, followed by polymerization under heating at 70° C. for 0.5 hours.
- 2-Butanone: 200.0 g
- Glycidyl methacrylate: 90.0 g
- Methacrylic acid: 10.0 g
- 2,2'-Azobis(2,4-dimethylvaleronitrile): 4.0 g Next, in the same manner as in Synthesis Example 1, a 30% by mass MMP of alkali-soluble polymer (5) was prepared. The yield of the polymer was found to be 85%. Also, through GPC analysis, alkali-soluble polymer (5) was found to have a weight average molecular weight (converted to polyethylene oxide (standard)) of 8,900.

Synthesis Example 6

Synthesis of Alkali-Soluble Polymer (6)

The same components as in Synthesis Example 1, except that (3-ethyl-3-oxetanyl)methyl methacrylate, methylglycidyl methacrylate, 2-hydroxylethyl methacrylate and methacrylic acid were used respectively as monomer b1, monomer b2, monomer b3 and monomer b4, were charged in the following formulation, followed by polymerization.
- 2-Butanone: 200.0 g
- TC-110S: 30.0 g
- (3-Ethyl-3-oxetanyl)methyl methacrylate: 30.0 g
- Methylglycidyl methacrylate: 30.0 g
- 2-Hydroxylethyl methacrylate: 6.0 g
- Methacrylic acid: 4.0 g
- 2,2'-Azobis(2,4-dimethylvaleronitrile): 2.0 g Next, in the same manner as in Synthesis Example 1, a 30% by mass MMP of alkali-soluble polymer (6) was prepared. The yield of the polymer was found to be 74%. Also, through GPC analysis, alkali-soluble polymer (6) was found to have a weight average molecular weight (converted to polyethylene oxide (standard)) of 5,200.

Synthesis Example 7

Synthesis of Alkali-Soluble Polymer (7)

The same components as in Synthesis Example 1, except that (3-ethyl-3-oxetanyl)methyl methacrylate, methylglycidyl methacrylate, 2-hydroxylpropyl methacrylate and tricyclo[5.2.1.0(2,6)]decanyl methacrylate were used respectively as monomer b1, monomer b2, monomer b3 and monomer b4, were charged in the following formulation, followed by polymerization.
- 2-Butanone: 200.0 g
- TC-110S: 20.0 g
- (3-Ethyl-3-oxetanyl)methyl methacrylate: 15.0 g
- Methylglycidyl methacrylate: 30.0 g
- 2-Hydroxylpropyl methacrylate: 25.0 g
- Tricyclo[5.2.1.0(2,6)]decanyl methacrylate: 10.0 g
- 2,2'-Azobis(2,4-dimethylvaleronitrile): 2.0 g Next, in the same manner as in Synthesis Example 1, a 30% by mass MMP of alkali-soluble polymer (7) was prepared. The yield of the polymer was found to be 77%. Also, through GPC analysis, alkali-soluble polymer (7) was found to have a weight average molecular weight (converted to polyethylene oxide (standard)) of 5,600.

Comparative Synthesis Example 1

Synthesis of Comparative Copolymer (1)

In the same manner as in Synthesis Example 1, the below-listed components were charged in the following formulation, followed by polymerization.
- 2-Butanone: 200.0 g
- (3-Ethyl-3-oxetanyl)methyl acrylate: 19.0 g
- Glycidyl acrylate: 31.0 g
- 2-Hydroxylethyl acrylate: 50.0 g
- 2,2'-Azobis(2,4-dimethylvaleronitrile): 2.0 g Next, in the same manner as in Synthesis Example 1, a 30% by mass MMP of comparative copolymer (1) was prepared. The yield of the polymer was found to be 80%. Also, through GPC analysis, comparative copolymer (1) was found to have a weight average molecular weight (converted to polyethylene oxide (standard)) of 6,200.

Comparative Synthesis Example 2

Synthesis of Comparative Copolymer (2)

In the same manner as in Synthesis Example 1, the below-listed components were charged in the following formulation, followed by polymerization.
- 2-Butanone: 200.0 g
- (3-Ethyl-3-oxetanyl)methyl acrylate: 15.0 g
- Glycidyl acrylate: 30.0 g
- 2-Hydroxylethyl acrylate: 45.0 g
- Methacrylic acid: 10.0 g
- 2,2'-Azobis(2,4-dimethylvaleronitrile): 2.0 g Next, in the same manner as in Synthesis Example 1, a 30% by mass MMP of comparative copolymer (2) was prepared. The yield of the polymer was found to be 78%. Also, through GPC analysis, comparative copolymer (2) was found to have a weight average molecular weight (converted to polyethylene oxide (standard)) of 5,900.

Comparative Synthesis Example 3

Synthesis of Comparative Copolymer (3)

A four-necked flask equipped with a stirrer was purged with nitrogen. The below-listed components were charged into the flask in the following formulation.
- Diethylene glycol dimethyl ether: 204.0 g
- Styrene: 10.0 g
- Dicyclopentanyl methacrylate: 35.0 g
- Glycidyl methacrylate: 40.0 g
- Methacrylic acid: 15.0 g
- 2,2'-Azobisisobutyronitrile: 4.0 g Next, while being stirred, the above-prepared solution was heated to 80° C. and maintained at the same temperature for 5 hours. The resultant solution was heated at 90° C. for 1 hour to complete polymerization. The reaction mixture was cooled to room temperature and then added dropwise to a large amount of water. The precipitates that formed were washed with water and redissolved in tetrahydrofuran (90 g). The resultant solution was added again to a large amount of water for precipitation. This redissolving-precipitating procedure was performed three times in total. The obtained precipitates were dried under vacuum at 60° C. for 48 hours, to thereby produce a target copolymer. Thereafter, MMP was mixed with the thus-produced copolymer so that the solid content thereof was adjusted to 30% by mass, whereby comparative copolymer (3) was obtained. The yield of the polymer was found to be 65%. Also, through GPC analysis, comparative copolymer (3) was found to have a weight average molecular weight (converted to polyethylene oxide (standard)) of 4,200.

Comparative Synthesis Example 4

Synthesis of Comparative Copolymer (4)

A four-necked flask equipped with a stirrer was purged with nitrogen. The below-listed components were charged into the flask in the following formulation.
Propylene glycol monomethyl ether acetate: 220.0 g
Styrene: 20.0 g
Methacrylic acid: 15.0 g
N-Phenylmaleimide: 20.0 g
(3-Ethyl-3-oxetanyl)methyl methacrylate: 45.0 g
α-Methylstyrene dimer: 1.5 g
2,2'-Azobis(2,4-dimethylvaleronitrile): 7.0 g Next, the above-prepared solution was stirred with nitrogen purging. The resultant solution was heated to 70° C. and maintained at the same temperature for 5 hours. The solid content of the obtained comparative polymer (4) was found to be 31.0%. Also, through GPC analysis, comparative copolymer (4) was found to have a weight average molecular weight (converted to polyethylene oxide (standard)) of 10,600.

Comparative Synthesis Example 5

Synthesis of Comparative Copolymer (5)

A four-necked flask equipped with a stirrer was purged with nitrogen. The below-listed components were charged into the flask in the following formulation.
Diethylene glycol dimethyl ether: 220.0 g
Styrene: 20.0 g
Methacrylic acid: 15.0 g
Glycidyl methacrylate: 40.0 g
2-Hydroxylethyl methacrylate: 25.0 g
2,2'-Azobis(2,4-dimethylvaleronitrile): 8.0 g Next, the above-prepared solution was stirred with nitrogen purging. The resultant solution was heated to 70° C. and maintained at the same temperature for 5 hours. The solid content of the obtained comparative polymer (5) was found to be 30.6%. Also, through GPC analysis, comparative copolymer (4) was found to have a weight average molecular weight (converted to polyethylene oxide (standard)) of 9,800.

<Preparation of Silver Nanowire Dispersion>
—Preparation of Silver Nanowire Dispersion (1)—
The following additive liquids A, G and H were prepared in advance.
[Additive Liquid A]
Silver nitrate powder (0.51 g) was dissolved in pure water (50 mL). Subsequently, 1N aqueous ammonia was added to the resultant solution until the solution became transparent. Then, pure water was added to the transparent solution so that the total amount was 100 mL.
[Additive Liquid G]
Glucose powder (0.5 g) was dissolved in pure water (140 mL) to thereby prepare additive liquid G.
[Additive Liquid H]
Hexadecyl-trimethylammonium bromide (HTAB) powder (0.5 g) was dissolved in pure water (27.5 mL) to thereby prepare additive liquid H.

Next, a silver nanowire aqueous dispersion was prepared in the following manner.

Specifically, pure water (410 mL) was added to a three-necked flask. With stirring at 20° C., additive liquid H (82.5 mL) and additive liquid G (206 mL) were added to the flask using a funnel (first step). Additive liquid A (206 mL) was added to the resultant liquid at a flow rate of 2.0 mL/min under stirring at 800 rpm (second step). Ten minutes after, additive liquid H (82.5 mL) was added thereto. The resultant mixture was increased to an internal temperature of 75° C. at a temperature increasing rate of 3° C./min, followed by heating for 5 hours under stirring at 200 rpm.

The obtained aqueous dispersion was cooled. Separately, an ultrafiltration apparatus was assembled by connecting together, via silicone tubes, an ultrafiltration module SIP1013 (product of Asahi Kasei Corporation, molecular weight cut-off: 6,000), a magnet pump and a stainless steel cup.

The silver nanowire dispersion (aqueous solution) was added to the stainless steel cup and ultrafiltrated by operating the pump. At the time when the amount of the filtrate reached 50 mL, distilled water (950 mL) was added to the stainless steel cup for washing. The washing was repeated until the conductivity reached 50 μS/cm or lower, followed by concentrating, whereby a silver nanoparticle aqueous dispersion was obtained.

The obtained silver nanoparticles were found to have a wire shape with an average minor axis length of 18 nm and an average major axis length of 38 μm.

Subsequently, polyvinylpyrrolidone (K-30) and propylene glycol monomethyl ether (PGME) were added to the silver nanoparticle aqueous dispersion, followed by centrifugation. The supernatant was removed through decantation and then PGME was added to the precipitate for redispersion. This centrifugation/decantation/redispersion procedure was repeated three times in total to thereby obtain silver nanowire PGME dispersion (1). The silver content of the dispersion was found to be 2% by mass.

Regarding the obtained silver nanowires (1), the variation coefficient of the diameters, the appropriate wire yield, and the degree of sharpness were found to be 22.3%, 78.6% and 44.2, respectively.

—Preparation of Silver Nanowire Dispersion (2)—
Ethylene glycol (30 mL) was added to a three-necked flask, followed by heating to 160° C. Thereafter, 36 mM PVP (K-55), 3 μM acetylacetonato iron, 60 μM ethylene glycol solution of sodium chloride (18 mL), and 24 mM ethylene glycol solution of silver nitrate (18 mL) were added to the flask at a rate of 1 mL/min. The resultant mixture was heated at 160° C. for 60 min and then cooled to room temperature. Thereafter, water was added thereto, followed by centrifugation. The mixture was purified until the conductivity reached 50 μS/cm or lower, to thereby obtain a silver nanoparticle aqueous dispersion.

The obtained silver nanoparticles were found to have a wire shape with an average minor axis length of 110 nm and an average major axis length of 32 μm.

After the silver nanoparticle aqueous dispersion had been centrifugated, water was removed through decantation and then propylene glycol monomethyl ether (PGME) was added to the precipitate for redispersion. This centrifugation/decantation/redispersion procedure was repeated three times in total to thereby obtain silver nanowire PGME dispersion (2). The silver content of the dispersion was found to be 2% by mass.

Regarding the obtained silver nanowires (2), the variation coefficient of the diameters, the appropriate wire yield, and the degree of sharpness were found to be 86.3%, 75.4% and 45.6, respectively.

Example 1

Preparation of Positive-Type Photosensitive Composition

Alkali-soluble polymer (1) obtained in Synthesis Example 1, a condensate formed between 4,4'-[1-[4-[1-[4-hydroxylphenyl]-1-methylethyl]phenyl]ethylidene]bisphenol and 1,2-naphthoquinone diazide-5-sulfonic acid chloride (average esterification rate: 58%, which may be referred to as "PAD," hereinafter) (1,2-quinonediazide compound), MEGAFACK R-08 (product of DIC Corporation, a fluorine-containing surfactant) (additive) (which may be referred to as "R-08") and MMP (solvent) were mixed/dissolved in the following formulation.

MMP: 50.00 g
30% by mass solution of alkali-soluble polymer (1): 10.00 g
PAD: 0.60 g
R-08: 0.006 g Next, silver nanowire PGME dispersion (1) was added to the MMP solution so that the ratio by mass of the solid content of silver to alkali-soluble polymer (1) was 2:1, to thereby prepare a positive-type photosensitive composition.

The above-prepared positive-type photosensitive composition of Example 1 was evaluated in the following manner in terms of various properties. The results are shown in Table 1.

<(1) Formation of Patterned Transparent Conductive Film>

The positive-type photosensitive composition prepared in Example 1 was applied onto a glass substrate, followed by drying for 2 min on a hot plate set to 90° C. (prebaking). The resultant substrate was exposed through a mask to i beams (365 nm) from a high-pressure mercury lamp at 100 mJ/cm$^2$ (dose: 20 mW/cm$^2$). The exposed glass substrate was dip developed with 0.4% by mass aqueous tetramethylammonium hydroxide solution for 60 sec, to thereby remove the exposed portions. The developed substrate was washed with pure water for 60 sec and then dried for 2 min on a hot plate set to 100° C. Using the same exposing apparatus, the entirety of the resultant substrate was exposed through no mask to light at a dose of 300 mJ/cm$^2$. Then, the substrate was baked in an oven at 230° C. for 30 min, to thereby form a patterned transparent conductive film.

<(2) Conductivity>

The postbaked, patterned transparent conductive film obtained in the above (1) was measured in surface resistance using Loresta-GP MCP-T600 (product of Mitsubishi Chemical Corporation).

<(3) Resolution>

The postbaked, patterned transparent conductive film (substrate) obtained in the above (1) was observed with an optical microscope at 400-fold magnification, confirming the glass areas exposed (the mask size) in the hole pattern. The case where the hole pattern was not resoluted (i.e., the holes were not individualized) due to poor dissolvability was judged as NG (No Good).

<(4) Transparency>

Using Heiz Gard Plus (product of Gardner Co., Ltd.), the patterned transparent conductive film obtained in the above (1) was measured in terms of the total light transmittance (%).

<(5) Solvent Resistance>

The patterned transparent conductive film (substrate) obtained in the above (1) was immersed for 5 min in N-methyl-2-pyrrolidone of 100° C., confirming the glass areas exposed (the mask size). The case where the hole pattern was deformed due to poor solvent resistance was judged as NG (No Good).

<(6) Alkali Resistance>

The patterned transparent conductive film (substrate) obtained in the above (1) was immersed for 10 min in a 5% aqueous potassium hydroxide solution of 60° C., confirming the glass areas exposed (the mask size). The case where the hole pattern was deformed due to poor alkali resistance was judged as NG (No Good).

<(7) Heat Resistance>

The patterned transparent conductive film (substrate) obtained in the above (1) was heated for 1 hour in an oven set to 230° C., and measured in terms of the total light transmittance (%) similar to the above (4).

<(8) Adhesion>

The patterned transparent conductive film (substrate) obtained in the above (1) was evaluated by the lattice pattern cutting test (cross cut test) based on the number of 1 mm×1 mm cut sections remaining after release with a piece of tape:
Good: $\geq$95 (out of 100), and
NG (No Good): <95.

Example 2

The procedure of Example 1 was repeated, except that alkali-soluble polymer (1) was changed to alkali-soluble polymer (2) obtained in Synthesis Example 2, to thereby prepare and evaluate a positive-type photosensitive composition. The results are shown in Table 1.

Example 3

The procedure of Example 1 was repeated, except that alkali-soluble polymer (1) was changed to alkali-soluble polymer (3) obtained in Synthesis Example 3, to thereby prepare and evaluate a positive-type photosensitive composition. The results are shown in Table 1.

Example 4

The procedure of Example 1 was repeated, except that alkali-soluble polymer (1) was changed to alkali-soluble polymer (4) obtained in Synthesis Example 4, to thereby prepare and evaluate a positive-type photosensitive composition. The results are shown in Table 1.

Example 5

The procedure of Example 1 was repeated, except that alkali-soluble polymer (1) obtained in Synthesis Example 1 was changed to a mixture of the following formulation containing alkali-soluble polymer (4) of Synthesis Example 4 and alkali-soluble polymer (5) of Synthesis Example 5, to thereby prepare and evaluate a positive-type photosensitive composition. The results are shown in Table 1.

MMP: 1.40 g
30% by mass solution of alkali-soluble polymer (4): 6.00 g
30% by mass solution of alkali-soluble polymer (5): 4.00 g
PAD: 0.60 g
R-08: 0.006 g

Example 6

The procedure of Example 1 was repeated, except that alkali-soluble polymer (1) was changed to alkali-soluble polymer (6) obtained in Synthesis Example 6, to thereby prepare and evaluate a positive-type photosensitive composition. The results are shown in Table 1.

Example 7

The procedure of Example 1 was repeated, except that alkali-soluble polymer (1) was changed to alkali-soluble polymer (7) obtained in Synthesis Example 7, to thereby prepare and evaluate a positive-type photosensitive composition. The results are shown in Table 1.

Example 8

The procedure of Example 1 was repeated, except that silver nanowire PGME dispersion (1) was changed to silver nanowire PGME dispersion (2), to thereby prepare and evaluate a positive-type photosensitive composition. The results are shown in Table 1.

Example 9

The procedure of Example 1 was repeated, except that, in order to form the same positive-type photosensitive composition as that of Example 1 on the substrate, silver nanowire PGME dispersion (1) was applied onto the substrate without being mixed with an MMP solution of alkali-soluble polymer (1) and then an MMP solution of alkali-soluble polymer (1) was applied onto the dispersion, followed by drying, to thereby evaluate the formed film. The results are shown in Table 1.

Example 10

The procedure of Example 1 was repeated, except that silver nanowire PGME dispersion (1) was changed to single wall carbon nanotubes prepared by the following method, to thereby prepare and evaluate a positive-type photosensitive composition. The results are shown in Table 1.

—Preparation of Single Wall Carbon Nanotube—

Following the procedure of Example 1 described in Japanese Patent (JP-B) No. 3903159, a single wall carbon nanotube dispersion liquid was prepared.

Specifically, single wall carbon nanotubes (synthesized referring to the literature Chemical Physics Letters, 323 (2000) pp. 580-585) and a polyoxyethylene-polyoxypropylene copolymer (dispersing agent) were added to an isopropyl alcohol/water (3:1) mixture (solvent). The carbon nanotube content and the dispersion content were 0.003% by mass and 0.05% by mass, respectively.

Regarding the obtained carbon nanotubes, the major axis length was found to be 1 μm to 3 μm, the minor axis length 1 nm to 2 nm, and the aspect ratio 1,000 to 1,500.

Comparative Example 1

The procedure of Example 1 was repeated, except that alkali-soluble polymer (1) was changed to comparative copolymer (1) of Comparative Synthesis Example 1, to thereby prepare and evaluate a positive-type photosensitive composition. The results are shown in Table 2.

Comparative Example 2

The procedure of Example 1 was repeated, except that alkali-soluble polymer (1) was changed to comparative copolymer (2) of Comparative Synthesis Example 2, to thereby prepare and evaluate a positive-type photosensitive composition. The results are shown in Table 1.

Comparative Example 3

The procedure of Example 1 was repeated, except that alkali-soluble polymer (1) was changed to comparative copolymer (3) of Comparative Synthesis Example 3, to thereby prepare and evaluate a positive-type photosensitive composition. The results are shown in Table 1.

Comparative Example 4

Comparative polymer (4) of Comparative Synthesis Example 4, PAD (1,2-quinonediazide compound), R-08 (product of DIC Corporation, a fluorine-containing surfactant) (additive) and propylene glycol monomethyl ether acetate (solvent) were mixed/dissolved in the following formulation, to thereby prepare a positive-type photosensitive composition.

Propylene glycol monomethyl ether acetate: 1.72 g
31% by mass solution of Comparative polymer (4): 9.68 g
PAD: 0.60 g
R-08: 0.006 g The obtained positive-type photosensitive composition was evaluated similar to Example 1. The results are shown in Table 1.

Comparative Example 5

Comparative polymer (5) of Comparative Synthesis Example 5, PAD (1,2-quinonediazide compound), Surfron SC-101 (product of SEIMI CHEMICAL CO., LTD., a fluorine-containing surfactant) (additive) and diethylene glycol dimethyl ether (solvent) were mixed/dissolved in the following formulation, to thereby prepare a positive-type photosensitive composition.

Propylene glycol monomethyl ether acetate: 1.60 g
30.6% by mass solution of Comparative polymer (5): 9.80 g
PAD: 0.60 g
SC-101: 0.006 g The obtained positive-type photosensitive composition was evaluated similar to Example 1. The results are shown in Table 1.

Comparative Example 6

The procedure of Example 1 was repeated, except that silver nanowire PGME dispersion (1) was changed to spherical silver particles prepared by the method described in The Journal of Physical Chemistry (2005) Vol. 109, p. 5497, to thereby prepare and evaluate a positive-type photosensitive composition. The results are shown in Table 1. The thus-prepared spherical silver particles were found to have a diameter of 26 nm.

Comparative Example 7

The procedure of Example 1 was repeated, silver nanowire PGME dispersion (1) was changed to needle-shaped conductive fine particles (FS-10, ISHIHARA SHANGYO KAISHA, LTD., average major axis length: 0.5 μm, minor axis length: 0.02 μm, aspect ratio: 25), to thereby prepare and evaluate a positive-type photosensitive composition. The results are shown in Table 1.

TABLE 1

|  | Conductivity (Ω/square) | Resolution | Transparency (%) | Solvent resistance | Alkali resistance | Heat resistance (%) | Adhesion |
|---|---|---|---|---|---|---|---|
| Ex. 1 | 11 | Good | 92 | Good | Good | 91 | Good |
| Ex. 2 | 12 | Good | 91 | Good | Good | 90 | Good |
| Ex. 3 | 14 | Good | 92 | Good | Good | 91 | Good |
| Ex. 4 | 13 | Good | 91 | Good | Good | 91 | Good |
| Ex. 5 | 12 | Good | 92 | Good | Good | 91 | Good |
| Ex. 6 | 13 | Good | 91 | Good | Good | 90 | Good |
| Ex. 7 | 11 | Good | 92 | Good | Good | 91 | Good |
| Ex. 8 | 12 | Good | 88 | Good | Good | 87 | Good |
| Ex. 9 | 14 | Good | 84 | Good | Good | 82 | Good |
| Ex. 10 | 240 | Good | 78 | Good | Good | 77 | Good |
| Comp. Ex. 1 | 11 | NG | 92 | Good | Good | 91 | Good |
| Comp. Ex. 2 | 12 | NG | 91 | NG | NG | 90 | Good |
| Comp. Ex. 3 | 14 | NG | 92 | NG | NG | 91 | Good |
| Comp. Ex. 4 | 13 | Good | 91 | NG | NG | 91 | Good |
| Comp. Ex. 5 | 12 | NG | 92 | NG | NG | 91 | Good |
| Comp. Ex. 6 | >2500 | NG | 64 | NG | Good | 61 | Good |
| Comp. Ex. 7 | 770 | NG | 74 | NG | Good | 72 | Good |

As is clear from Table 1, the positive-type photosensitive compositions of Examples 1 to 10 (the present invention) were found to be excellent in solvent resistance, alkali resistance, heat resistance, transparency, adhesion to a base, and conductivity. In addition, the transparent conductive film was formed by applying once each composition onto a substrate. In particular, the positive-type photosensitive compositions containing silver nanowires were found to exhibit remarkably advantageous effects.

Notably, although almost all the evaluation results in Example 9 were good, the transparency was degraded due to aggregation occurring when only silver nanowire dispersion was applied, probably because of the absence of the binder polymer.

The evaluation results in Example 10, using single wall carbon nanotubes instead of silver nanowires, were generally good but inferior in transparency and conductivity to the compositions containing a silver nanowire dispersion.

In contrast, the compositions of Comparative Examples 1 to 5, containing a comparative synthetic polymer and silver nanowires, were found not to exhibit excellent solvent resistance, alkali resistance, heat resistance, transparency, adhesion to a base, and conductivity which are comparable to those in Examples.

Also, in the compositions of Comparative Examples 6 and 7, containing spherical silver particles or needle-shaped conductive particles instead of silver nanowires, a large amount of the silver particles or the needle-shaped conductive particles had to be applied for conduction. As a result, the transparency was considerably decreased and the resolution and the solvent resistance were judged as NG.

The present invention first discloses that the compositions containing both a synthetic polymer and nanowire structures exhibit excellent solvent resistance and resolution, which is surprising, unexpected results.

Example 11 and Comparative Example 8

Fabrication of Display Element

In the following manner, a display element was fabricated using the positive-type photosensitive composition of the present invention.

First, a bottom gate-type TFT was formed on a glass substrate, and an insulative film of $Si_3N_4$ was formed so as to cover the TFT. Next, contact holes were formed in the insulative film, and wirings (height: 1.0 μm) connected through the contact holes to the TFT were formed on the insulative film.

Subsequently, in order to planarize irregularities caused as a result of formation of the wirings, a planarizing layer was formed on the insulative layer so as to embed the irregularities. Then, contact holes were formed therein to obtain planarizing film A.

Next, planarizing film A was coated with the positive-type photosensitive composition of Example 1 through slit coating, followed by prebaking on a hot plate (90° C.×2 min). The prebaked product was irradiated through a mask with i beams (365 nm) from a high-pressure mercury lamp at 100 mJ/cm$^2$ (dose: 20 mW/cm$^2$), and then was developed with an alkaline developer (0.4% aqueous TMAH solution) to remove the exposed portions, followed by thermal treatment at 220° C./1 hr, to thereby obtain TFT-A (Example 11). The operation of the TFT was found to be good.

In Comparative Example 8, a patterned conductive film of ITO was formed on planarizing film A, to thereby obtain TFT-B (Comparative Example 8). In Comparative Example 8, the operation of the TFT was confirmed similarly, but the TFT was found to be inferior in transparency to that using the positive-type photosensitive composition of Example 1. In addition, uneven interference was observed in this TFT, and it was judged that it was problematic in practical use.

Comparative Example 9 and Example 12

Fabrication of Integrated Solar Battery

—Fabrication of Amorphous Solar Battery (Super Straight Type)—

A fluorine-doped tin oxide film (transparent conductive film) having a thickness of 700 nm was formed on a glass substrate through MOCVD. Through plasma-enhanced chemical vapor deposition (PECVD), on the fluorine-doped thin oxide film were formed a p-type amorphous silicon film having a thickness of about 15 nm, an i-type amorphous silicon film having a thickness of about 350 nm, and an n-type amorphous silicon film having a thickness of about 30 nm. As a backside reflecting electrode, a gallium-doped zinc oxide layer having a thickness of 20 nm and a silver layer having a thickness of 200 nm were formed, to thereby fabricate a photoelectric conversion element 101 (Comparative Example 9).

A photoelectric conversion element 102 (Example 12) was produced in the same manner as in the photoelectric conversion element 101, except that, instead of forming the fluorine-doped thin oxide film, the positive-type photosensitive composition of Example 1 was applied onto the glass substrate as a transparent electrode so that the coated amount thereof became 0.1 g/m² in terms of Ag amount, followed by heating at 150° C. for 10 min.

Comparative Example 10 and Example 13

Fabrication of CIGS Solar Battery (Substrate Type)

On a soda-lime glass substrate, a molybdenum electrode having a film thickness of about 500 nm was formed by DC magnetron sputtering, a $Cu(In_{0.6}Ga_{0.4})Se_2$ thin film, which was a chalcopyrite semiconductor material film, having a film thickness of about 2.5 μm was formed thereon by vapor deposition, a cadmium sulfide thin film having a film thickness of about 50 nm was formed thereon by solution deposition, a zinc oxide thin film having a film thickness of about 50 nm was formed thereon by MOCVD, and a boron-doped zinc oxide thin film (transparent conductive layer) having a film thickness of about 100 nm was formed thereon by DC magnetron sputtering, to thereby produce a photoelectric conversion element 201 (Comparative Example 10).

A photoelectric conversion element 202 was produced in the same manner as in the photoelectric conversion element 201, except that, for forming a transparent electrode, the positive-type photosensitive composition of Example 1 was used instead of the boron-doped zinc oxide. Specifically, after formation of the cadmium sulfide thin film, the positive-type photosensitive composition of Example 1 was applied on the cadmium sulfide thin film so that the coated amount thereof became 0.1 g/m² in terms of Ag amount. The applied composition was heated at 150° C. for 10 min to thereby produce a photoelectric conversion element 202 (Example 13).

Next, each of the thus-fabricated solar batteries was evaluated in terms of conversion efficiency in the following manner. The results are shown in Table 2.

<Evaluation of Solar Battery Properties>

Each solar battery was irradiated with simulated sunlight (AM 1.5, 100 mW/cm²) from a solar simulator, to thereby measure its solar battery properties (conversion efficiency).

TABLE 2

|  | Sample | Transparent conductive layer | Conversion efficiency (%) |
|---|---|---|---|
| Comp. Ex. 9 | 101 | Fluorine-doped tin oxide | 6 |
| Ex. 12 | 102 | Positive-type photosensitive composition of Ex. 1 | 8 |
| Comp. Ex. 10 | 201 | Zinc oxide | 7 |
| Ex. 13 | 201 | Positive-type photosensitive composition of Ex. 1 | 8 |

As is clear from Table 2, it was found that high conversion efficiency could be attained in any type of the integrated solar batteries by using the transparent conductive layer formed form the positive-type photosensitive composition of the present invention.

Note that, the difference in the effect between Comparative Examples and the present invention is 1% to 2% in number, but this difference is considered to be important as well known in the art.

The positive-type photosensitive composition of the present invention can be suitably used in forming, for example, a patterned transparent conductive film, a display element and an integrated solar battery.

What is claimed is:

1. A positive-type photosensitive composition comprising:
   an alkali-soluble polymer formed through copolymerization of monomer (A) represented by the following General Formula (I) and other radical polymerizable monomer (B),
   a 1,2-quinonediazide compound, and
   a nanowire structure dispersed in the positive-type photosensitive composition:

General Formula (I)

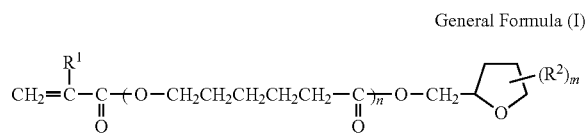

where R¹ represents a hydrogen atom or a methyl group, R² represents a hydrogen atom or a C1 to C5 alkyl group, n is an integer of 1 to 5, and m is an integer of 1 to 7.

2. A positive-type photosensitive composition comprising:
   an alkali-soluble polymer formed through copolymerization of monomer (A) represented by the following General Formula (II) and other radical polymerizable monomer (B),
   a 1,2-quinonediazide compound, and
   a nanowire structure dispersed in the positive-type photosensitive composition:

General Formula (II)

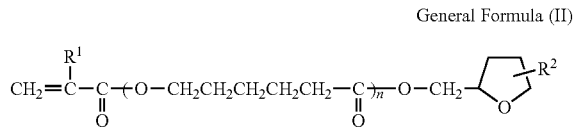

where R¹ represents a hydrogen atom or a methyl group, R² represents a hydrogen atom or a C1 to C5 alkyl group, and n is an integer of 1 to 5.

3. The positive-type photosensitive composition according to claim 1, wherein the alkali-soluble polymer is formed through copolymerization of monomer (A) in an amount of 1% by mass to 80% by mass and monomer (B) in an amount of 20% by mass to 99% by mass, on the basis of the total mass of monomer (A) and monomer (B).

4. The positive-type photosensitive composition according to claim 1, wherein the other radical polymerizable monomer (B) contains no radical polymerizable monomer having a carboxyl group.

5. The positive-type photosensitive composition according to claim 1, wherein the other radical polymerizable monomer (B) contains at least one selected from oxetanyl-containing radical polymerizable monomer (b1), oxyranyl-containing radical polymerizable monomer (b2) and hydroxyl group-containing radical polymerizable monomer (b3).

6. The positive-type photosensitive composition according to claim 5, wherein the alkali-soluble polymer is formed through copolymerization of monomer (A) in an amount of 0.5% by mass to 85% by mass, monomer (b1) in an amount of 1% by mass to 80% by mass, monomer (b2) in an amount of 5% by mass to 50% by mass, and monomer (b3) in an amount of 1% by mass to 60% by mass, on the basis of the total mass of monomer (A), monomer (b1), monomer (b2) and monomer (b3).

7. The positive-type photosensitive composition according to claim 5, wherein the alkali-soluble polymer is formed through copolymerization of monomer (A) in an amount of 1% by mass to 80% by mass, monomer (b1) in an amount of 5% by mass to 30% by mass, monomer (b2) in an amount of 10% by mass to 30% by mass, and monomer (b3) in an amount of 5% by mass to 50% by mass, on the basis of the total mass of monomer (A), monomer (b1), monomer (b2) and monomer (b3).

8. The positive-type photosensitive composition according to claim 5, wherein monomer (b1) contains at least one selected from (3-methyl-3-oxetanyl)methyl(meth)acrylate, (3-ethyl-3-oxetanyl)methyl (meth)acrylate, (3-methyl-3-oxetanyl)ethyl(meth)acrylate, (3-ethyl-3-oxetanyl)ethyl(meth)acrylate, (2-methyl-2-oxetanyl)methyl(meth)acrylate, (2-ethyl-2-oxetanyl)methyl(meth)acrylate, p-vinylphenyl-3-ethyloxetan-3-yl methyl ether, 2-phenyl-3-(meth)acryloxymethyloxetane, 2-trifluoromethyl-3-(meth) acryloxymethyloxetane and 4-trifluoromethyl-2-(meth) acryloxymethyloxetane.

9. The positive-type photosensitive composition according to claim 5, wherein monomer (b1) is a monomer represented by one of the following General Formulas (III) and (IV):

General Formula (III)

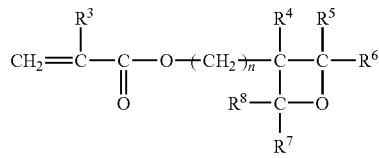

General Formula (IV)

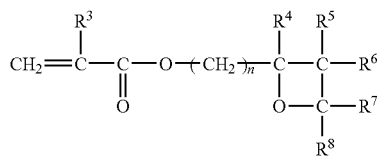

in General Formulas (III) and (IV), $R^3$ represents a hydrogen atom or a methyl group, $R^4$, $R^5$, $R^6$, $R^7$ and $R^8$ each independently represent a hydrogen atom, a C1 to C5 alkyl group, a C2 to C5 alkenyl group or a C2 to C5 alkynyl group, and n is an integer of 1 to 5.

10. The positive-type photosensitive composition according to claim 9, wherein the oxetanyl-containing radical polymerizable monomer (b1) represented by General Formula (III) contains at least one selected from (3-ethyl-3-oxetanyl) methyl acrylate and (3-ethyl-3-oxetanyl)methyl methacrylate.

11. The positive-type photosensitive composition according to claim 9, wherein the oxetanyl-containing radical polymerizable monomer (b1) represented by General Formula (IV) contains at least one selected from (2-ethyl-2-oxetanyl) methyl acrylate and (2-ethyl-2-oxetanyl)methyl methacrylate.

12. The positive-type photosensitive composition according to claim 5, wherein monomer (b2) contains at least one selected from glycidyl(meth)acrylate, methylglycidyl(meth) acrylate, α-ethylacrylic acid glycidyl ester and 3,4-epoxycyclohexyl(meth)acrylate.

13. The positive-type photosensitive composition according to claim 5, wherein monomer (b3) contains at least one selected from hydroxylmethyl(meth)acrylate, 2-hydroxylethyl(meth)acrylate, 2-hydroxylpropyl(meth)acrylate, 3-hydroxylpropyl(meth)acrylate and 4-hydroxylbutyl(meth)acrylate.

14. The positive-type photosensitive composition according to claim 1, wherein the 1,2-quinonediazide compound is at least one selected from 2,3,4-trihydroxylbenzophenone-1,2-naphthoquinone diazide-4-sulfonic acid ester, 2,3,4-trihydroxylbenzophenone-1,2-naphthoquinone diazide-5-sulfonic acid ester, 4,4'-[1-[4-[1-[4-hydroxylphenyl]-1-methylethyl]phenyl]ethylidene]bisphenol-1,2-naphthoquinone diazide-4-sulfonic acid ester and 4,4'-[1-[4-[1-[4-hydroxylphenyl]-1-methylethyl]phenyl]ethylidene]bisphenol-1,2-naphthoquinone diazide-5-sulfonic acid ester.

15. A positive-type photosensitive composition comprising:
an alkali-soluble polymer formed through copolymerization of monomer (A) represented by General Formula (II), at least one selected as oxetanyl-containing radical polymerizable monomer (b1) from (3-ethyl-3-oxetanyl) methyl acrylate and (3-ethyl-3-oxetanyl)methyl methacrylate, at least one selected as oxyranyl-containing radical polymerizable monomer (b2) from glycidyl (meth)acrylate, methylglycidyl(meth)acrylate, α-ethylacrylic acid glycidyl ester and 3,4-epoxycyclohexyl (meth)acrylate, and at least one selected as hydroxyl group-containing radical polymerizable monomer (b3) from 2-hydroxylethyl acrylate, 2-hydroxylethyl methacrylate, 2-hydroxylpropylacrylate and 2-hydroxylpropyl methacrylate,
4,4'-[1-[4-[1-[4-hydroxylphenyl]-1-methylethyl]phenyl] ethylidene]bisphenol-1,2-naphthoquinone diazide-5-sulfonic acid ester as a 1,2-quinonediazide compound, and
a nanowire structure dispersed in the positive-type photosensitive composition:

General Formula (II)

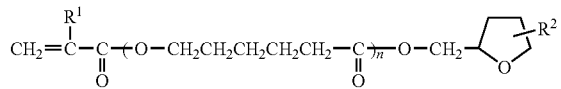

where $R^1$ represents a hydrogen atom or a methyl group, $R^2$ represents a hydrogen atom or a C1 to C5 alkyl group, and n is an integer of 1 to 5.

16. A positive-type photosensitive composition comprising:
an alkali-soluble polymer formed through copolymerization of monomer (A) represented by General Formula (II), at least one selected as oxetanyl-containing radical polymerizable monomer (b1) from (2-ethyl-2-oxetanyl) methyl acrylate and (2-ethyl-2-oxetanyl)methyl methacrylate, at least one selected from as oxyranyl-containing radical polymerizable monomer (b2) from glycidyl (meth)acrylate, methylglycidyl(meth)acrylate, ethylacrylic acid glycidyl ester and 3,4-epoxycyclohexyl(meth)acrylate, and at least one selected as hydroxyl group-containing radical polymerizable monomer (b3) from 2-hydroxylethyl acrylate, 2-hydroxylethyl methacrylate, 2-hydroxylpropyl acrylate and 2-hydroxylpropyl methacrylate;
4,4'-[1-[4-[1-[4-hydroxylphenyl]-1-methylethyl]phenyl] ethylidene]bisphenol-1,2-naphthoquinone diazide-5-sulfonic acid ester as a 1,2-quinonediazide compound, and a nanowire structure dispersed in the positive-type photosensitive composition:

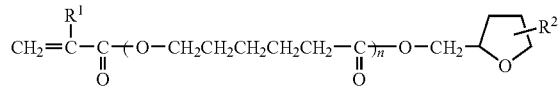

General Formula (II)

where $R^1$ represents a hydrogen atom or a methyl group, $R^2$ represents a hydrogen atom or a C1 to C5 alkyl group, and n is an integer of 1 to 5.

17. The positive-type photosensitive composition according to claim 16, wherein the alkali-soluble polymer is formed through copolymerization of monomer (A) in an amount of 1% by mass to 80% by mass, monomer (b1) in an amount of 5% by mass to 30% by mass, monomer (b2) in an amount of 10% by mass to 30% by mass, and monomer (b3) in an amount of 5% by mass to 50% by mass, on the basis of the total mass of monomer (A), monomer (b1), monomer (b2) and monomer (b3).

18. The positive-type photosensitive composition according to claim 1, wherein the nanowire structure a metal nanowire.

19. A transparent conductive film comprising:
a positive-type photosensitive composition which comprises an alkali-soluble polymer formed through copolymerization of monomer (A) represented by the following General Formula (I) and other radical polymerizable monomer (B), a 1,2-quinonediazide compound, and
a nanowire structure dispersed in the positive-type photosensitive composition:

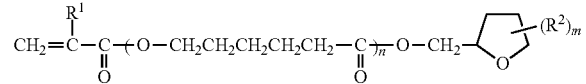

General Formula (I)

where $R^1$ represents a hydrogen atom or a methyl group, $R^2$ represents a hydrogen atom or a C1 to C5 alkyl group, n is an integer of 1 to 5, and m is an integer of 1 to 7.

20. The transparent conductive film according to claim 19, wherein the transparent conductive film is used in one of a display element and an integrated solar battery.

21. A patterned transparent conductive film, comprising:
a substrate, and
a transparent conductive film formed on the substrate,
wherein the transparent conductive film is patterned, and the transparent conductive film is formed of a positive-type photosensitive composition according to claim 1.

22. A patterned transparent conductive film, comprising:
a substrate, and
a transparent conductive film formed on the substrate,
wherein the transparent conductive film is patterned, and the transparent conductive film is formed of a positive-type photosensitive composition according to claim 2.

23. A patterned transparent conductive film, comprising:
a substrate, and
a transparent conductive film formed on the substrate,
wherein the transparent conductive film is patterned, and the transparent conductive film is formed of a positive-type photosensitive composition according to claim 15.

24. A patterned transparent conductive film, comprising:
a substrate, and
a transparent conductive film formed on the substrate,
wherein the transparent conductive film is patterned, and the transparent conductive film is formed of a positive-type photosensitive composition according to claim 16.

25. A method for forming a patterned transparent conductive film, comprising:
forming a coating film by applying a positive-type photosensitive composition on a non-conductive substrate,
drying the coating film,
exposing the coating film in a pattern through a mask,
developing the coating film exposed in the pattern, and
drying the developed coating film,
wherein the positive-type photosensitive composition is the positive-type photosensitive composition according to claim 1.

26. A method for forming a patterned transparent conductive film, comprising:
forming a coating film by applying a positive-type photosensitive composition on a non-conductive substrate,
drying the coating film,
exposing the coating film in a pattern through a mask,
developing the coating film exposed in the pattern, and
drying the developed coating film,
wherein the positive-type photosensitive composition is the positive-type photosensitive composition according to claim 2.

27. A method for forming a patterned transparent conductive film, comprising:
forming a coating film by applying a positive-type photosensitive composition on a non-conductive substrate,
drying the coating film,
exposing the coating film in a pattern through a mask,
developing the coating film exposed in the pattern, and
drying the developed coating film,
wherein the positive-type photosensitive composition is the positive-type photosensitive composition according to claim 15.

28. A method for forming a patterned transparent conductive film, comprising:
forming a coating film by applying a positive-type photosensitive composition on a non-conductive substrate,
drying the coating film,
exposing the coating film in a pattern through a mask,
developing the coating film exposed in the pattern, and
drying the developed coating film,
wherein the positive-type photosensitive composition is the positive-type photosensitive composition according to claim 16.

* * * * *